US012651098B1

(12) United States Patent

Hoetzlein

(10) Patent No.: US 12,651,098 B1

(45) Date of Patent: Jun. 9, 2026

(54) PARTICLE SIMULATIONS WITH SPARSE VOLUMES

(71) Applicant: Nvidia Corporation, Santa Clara, CA (US)

(72) Inventor: Rama Hoetzlein, Oakland, CA (US)

(73) Assignee: Nvidia Corporation, Santa Clara, CA (US)

( * ) Notice: Subject to any disclaimer, the term of this patent is extended or adjusted under 35 U.S.C. 154(b) by 816 days.

(21) Appl. No.: 16/372,123

(22) Filed: Apr. 1, 2019

Related U.S. Application Data

(60) Provisional application No. 62/651,600, filed on Apr. 2, 2018.

(51) Int. Cl.
| | |
|---|---|
| *G06F 30/20* | (2020.01) |
| *G06F 17/15* | (2006.01) |
| *G06T 1/20* | (2006.01) |
| *G06T 17/00* | (2006.01) |

(52) U.S. Cl.
CPC .............. *G06F 30/20* (2020.01); *G06F 17/15* (2013.01); *G06T 1/20* (2013.01); *G06T 17/005* (2013.01)

(58) Field of Classification Search
None
See application file for complete search history.

(56) References Cited

U.S. PATENT DOCUMENTS

| | | | | |
|---|---|---|---|---|
| 2010/0280806 | A1* | 11/2010 | Bowers ................... | G06F 30/00 |
| | | | | 703/6 |
| 2012/0249560 | A1* | 10/2012 | Dickenson .............. | G06F 17/16 |
| | | | | 345/505 |
| 2016/0307359 | A1* | 10/2016 | Desbrun ................. | G06F 30/20 |

OTHER PUBLICATIONS

Hoetzlein, GVDB: Raytracing Sparse Voxel Database Structures on the GPU, 2016, High Performance Graphics, pp. 109-117 (Year: 2016).*
Karlsson, Hybrid Particle-Grid Water Simulation using Multigrid Pressure Solver, 2014, Linkoping University, pp. 1-48 (Year: 2014).*
Museth, VDB: High-Resolution Sparse Volumes with Dynamic Topology, Jun. 2013, ACM, vol. 32 No. 3, pp. 1-22 (Year: 2013).*

(Continued)

*Primary Examiner* — Ryan F Pitaro
*Assistant Examiner* — Bernard E Cothran
(74) *Attorney, Agent, or Firm* — Hogan Lovells US LLP

(57) ABSTRACT
Various embodiments can perform efficient, large scale fluid simulation using a method, such as the fluid-implicit particle (FLIP) method, over a sparse hierarchy of grids. The grids may be represented in a number of different formats, and may include GVDB Voxels. Such approaches can handle tens of millions of particles within a virtually unbounded simulation domain. Embodiments can utilize a parallel, sparse grid hierarchy construction and provide for fast incremental updates on graphics processing unit (GPU) hardware, for example, for moving particles. In addition, a FLIP-based technique can be used to perform sparse, work-efficient parallel data gathering from particle to voxel. Various embodiments can also utilize a matrix-free GPU-based conjugate gradient solver optimized for sparse grids. Such approaches can provide orders of magnitude faster simulations on GPU hardware with respect to conventional simulations.

20 Claims, 13 Drawing Sheets

(56)          References Cited

OTHER PUBLICATIONS

Brackbill et al., FLIP: A Method for Adaptively Zoned, Particle-in-Cell Calculations of Fluid Flows in Two Dimensions, 1986, Journal of Computational Physics, pp. 314-343 (Year: 1986).*

Lundberg, Art Directed Fluid Flow with Secondary Water Effects, 2012, Linkoping University, pp. 1-37 (Year: 2012).*

WhatIs.com, Point cloud, 2021, WhatIs.com, pp. 1-2 (Year: 2021).*

PCMag Digital Group, GPU, 2021, PCMag Digital Group, pp. 1-7 (Year: 2021).*

Weiler et al., Projective Fluids, Oct. 2016, Motion in Games, pp. 1-6 (Year: 2016).*

Cornelis et al., IISPH-FLIP for incompressible fluids, 2014, EUROGRAPHICS, vol. 33 No. 2, pp. 255-262 (Year: 2014).*

D. Gutierrez, A. Sheffer; Fast Fluid Simulation with Sparse Volumes on the GPU; Eurographics, vol. 37, No. 2, 2018.

* cited by examiner

500

Global Voxel Data 502

3D Reduction 504
(shared memory)

One Subcell 506

1D Reduction (global)     Subcell Results 508

Output Value 510

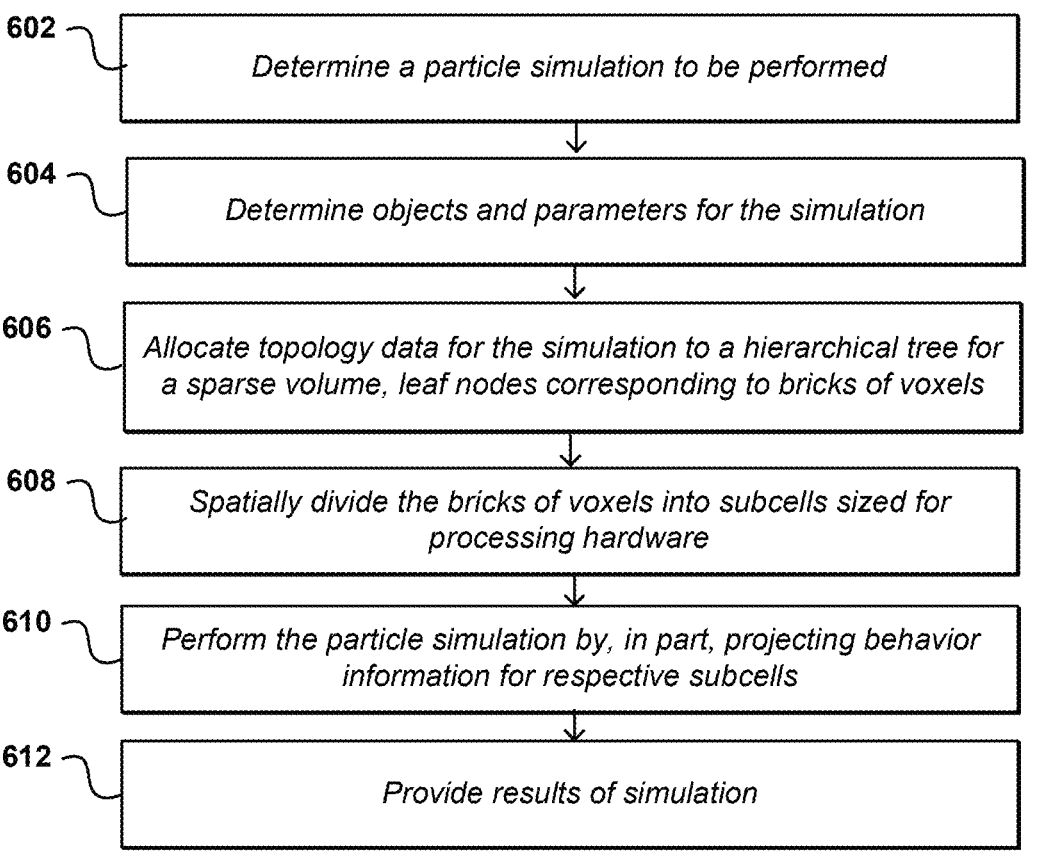

602 — Determine a particle simulation to be performed

604 — Determine objects and parameters for the simulation

606 — Allocate topology data for the simulation to a hierarchical tree for a sparse volume, leaf nodes corresponding to bricks of voxels 608 — Spatially divide the bricks of voxels into subcells sized for processing hardware 610 — Perform the particle simulation by, in part, projecting behavior information for respective subcells 612 — Provide results of simulation

FIG. 6

700

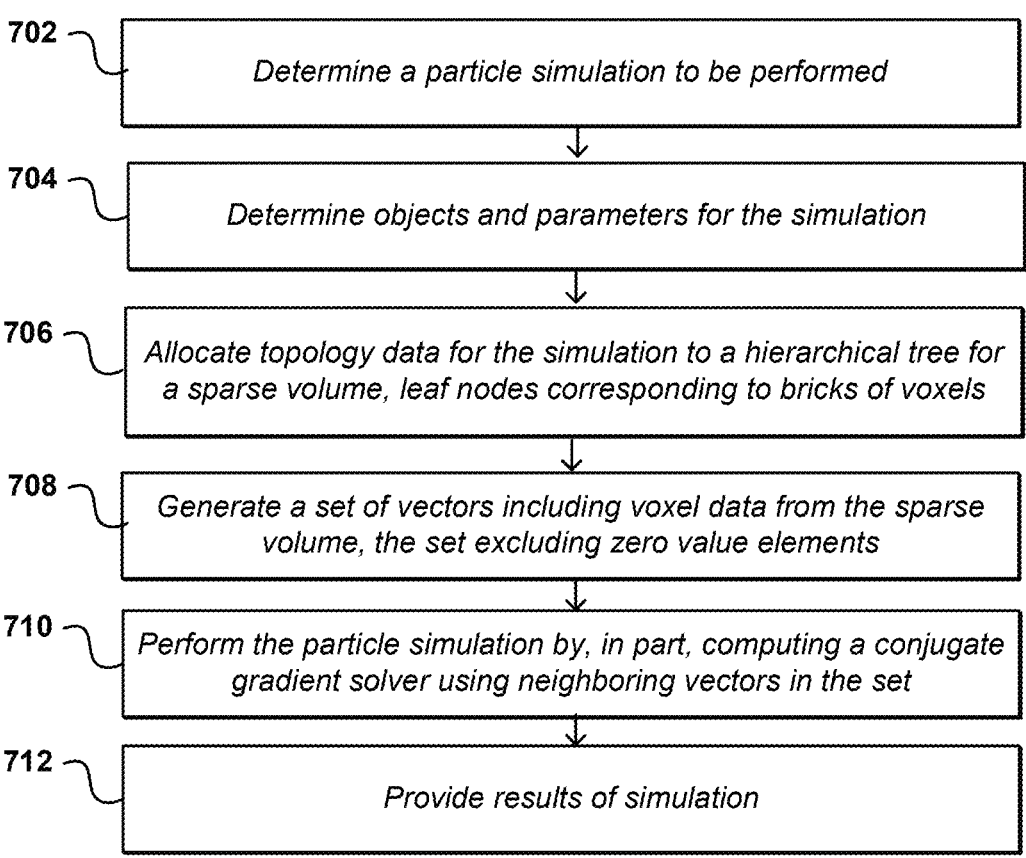

702  Determine a particle simulation to be performed

704  Determine objects and parameters for the simulation

706  Allocate topology data for the simulation to a hierarchical tree for a sparse volume, leaf nodes corresponding to bricks of voxels 708  Generate a set of vectors including voxel data from the sparse volume, the set excluding zero value elements 710  Perform the particle simulation by, in part, computing a conjugate gradient solver using neighboring vectors in the set 712  Provide results of simulation

FIG. 7

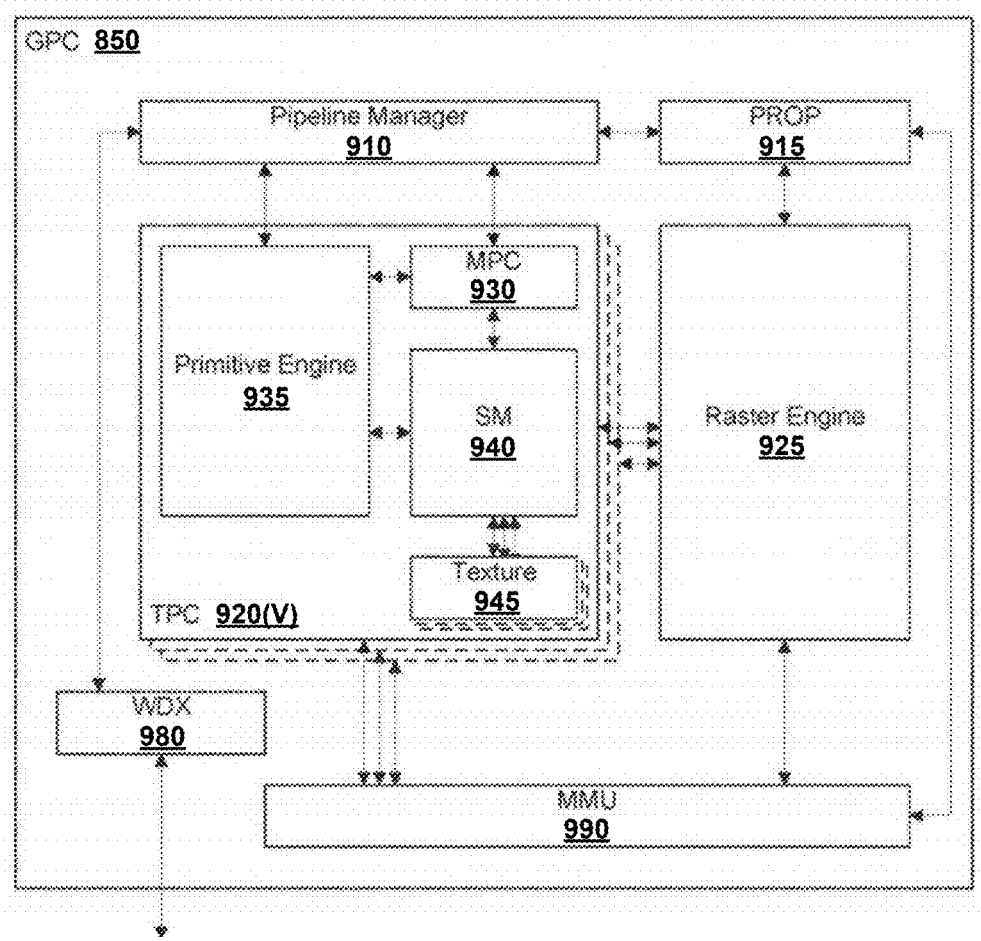
FIG. 9A

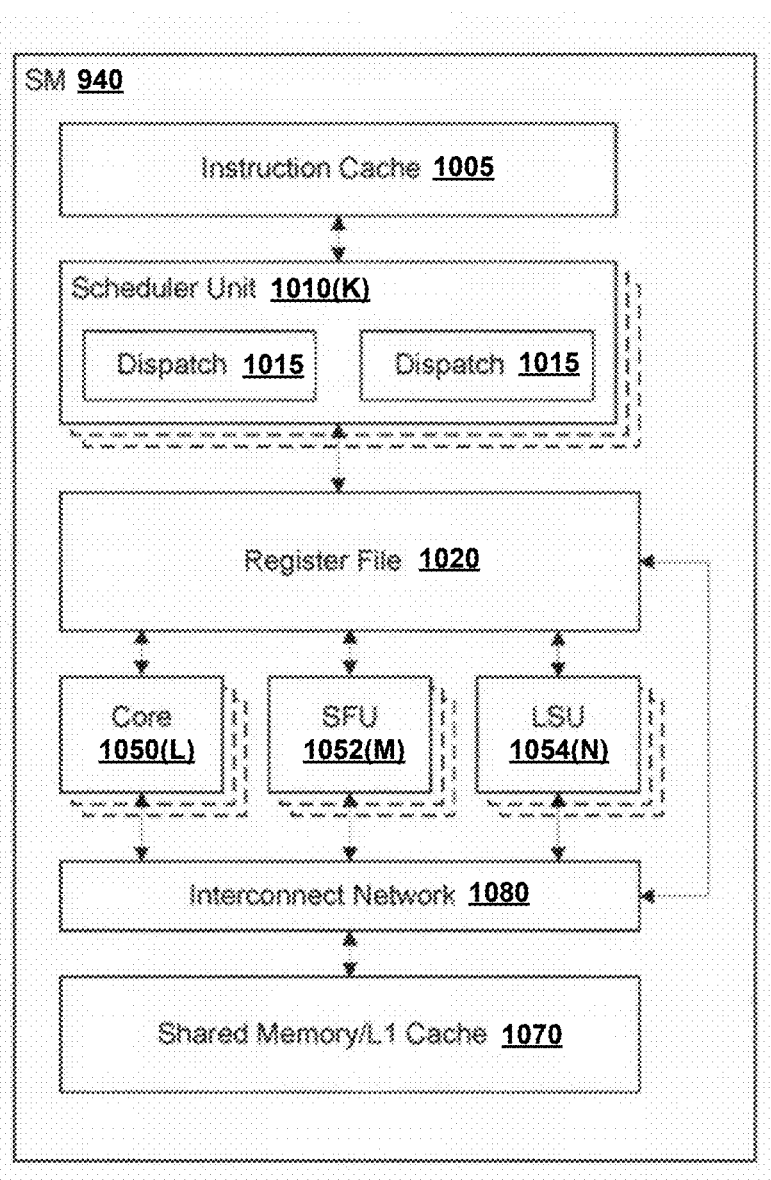
FIG. 10

PARTICLE SIMULATIONS WITH SPARSE VOLUMES

CROSS-REFERENCE TO RELATED APPLICATIONS

This application claims priority to U.S. Provisional Patent Application Ser. No. 62/651,600, filed Apr. 2, 2018, entitled "Fast Fluid Simulation with Sparse Volumes on the GPU," which is hereby incorporated herein by reference in its entirety for all purposes.

BACKGROUND

Computer simulations are becoming increasingly accurate, due in part to the increase in processing capacity and related technologies, but also due to an increase in user expectations. To improve accuracy, the simulations utilize an ever-increasing number of data points, such as virtual particles in a particle simulation. For fluid simulations, approaches such as the Fluid-Implicit-Particle (FLIP) method can provide highly accurate results, but such simulations require large numbers of particles and high resolution grids. The significant amount of memory needed to handle such simulations can prove challenging in many situations.

BRIEF DESCRIPTION OF THE DRAWINGS

Various embodiments in accordance with the present disclosure will be described with reference to the drawings, in which:

FIG. 6 illustrates a first example process for performing a simulation that can be utilized in accordance with various embodiments.

FIG. 7 illustrates a second example process for performing a simulation that can be utilized in accordance with various embodiments.

FIGS. 9A and 9B illustrate an example GPC and partition unit that can be utilized in accordance with various embodiments.

FIG. 10 illustrates an example streaming multi-processor that can be utilized in accordance with various embodiments.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Approaches in accordance with various embodiments provide for large scale particle simulation with substantially reduced memory requirements with respect to conventional approaches. In particular, various embodiments can perform efficient, large scale fluid simulation on processing hardware using a method, such as the fluid-implicit particle (FLIP) method, over a sparse hierarchy of grids. The grids may be represented in a number of different formats, and may include NVIDIA® GVDB Voxels. Such approaches can handle tens of millions of particles within a virtually unbounded simulation domain. Embodiments can utilize a parallel, sparse grid hierarchy construction and provide for fast incremental updates on a graphics processing unit (GPU), for example, for moving particles. In addition, a FLIP-based technique in accordance with various embodiments can perform sparse, work-efficient parallel data gathering from particle to voxel. Various embodiments can also utilize a matrix-free GPU-based conjugate gradient solver optimized for sparse grids. Such approaches can provide orders of magnitude faster simulations on GPU hardware with respect to conventional simulations running, for example, on central processing unit (CPU) hardware.

Various other functions can be implemented within the various embodiments as well as discussed and suggested elsewhere herein.

Figure 1:
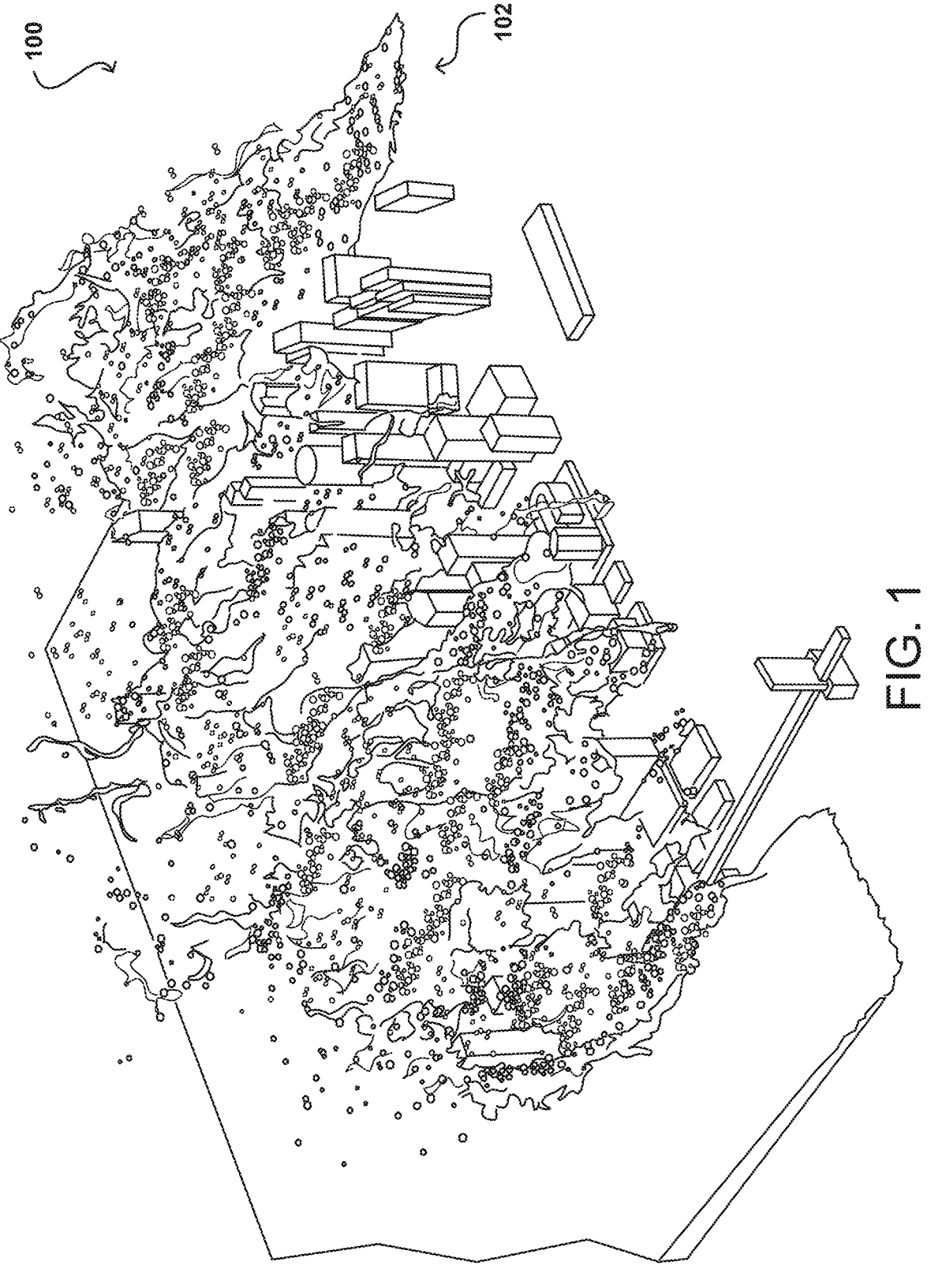
FIG. 1 illustrates an example of a fluid simulation for a computer graphics application that can be performed in accordance with various embodiments.

As mentioned, it may be desirable in various instances to perform a large scale particle simulation. For example, as illustrated in the example image 100 of FIG. 1, a computer graphics application for a movie or video game might involve a display of a large rush of water interacting with a number of objects, such as a large wave crashing into buildings along a coastline. In order to model and render the waves in a realistic fashion, a particle simulation can be used wherein "droplets" of water are modeled as individual particles 102 and the behavior of the particles is determined by the particle simulation, which can take into account factors such as the velocities and interaction of the various particles. In many instances, the simulation can be performed on one or more processors, such as a set of graphics processing units (GPUs). As mentioned, a large scale fluid simulation can be performed on GPU hardware using a methodology such as the fluid-implicit particle (FLIP) method. A simulation might involve tens of millions of particles within a virtually unbounded simulation domain. In some embodiments, a parallel sparse grid hierarchy construction can be utilized, along with fast incremental updates on the GPU for moving particles. In addition, a FLIP technique can take advantage of sparse, work-efficient parallel data gathering from particle to voxel, and a matrix-free GPU-based conjugate gradient solver optimized for sparse grids. Such approaches have demonstrated orders of magnitude faster simulations on a GPU with respect to conventional FLIP simulations running on a CPU.

The Fluid-Implicit-Particle (FLIP) method has been popular for simulating various types of fluid phenomena in computer graphics due to its simplicity and low dissipation. As a hybrid technique, high-quality FLIP simulations require both large numbers of particles and high resolution grids. Approaches in accordance with various embodiments can address these issues by, for example, reducing memory requirements, dynamically tracking the domain, and making use of parallel GPU-based computation residing on a sparse volume representation.

Various embodiments can take advantage of a sparse voxel structure, such as the GVDB voxel framework from NVIDIA Corporation. The GVDB framework is a GPU-friendly implementation of the VDB sparse grid hierarchy, allowing for the storage of much larger volumes than would be possible using a conventional volume structure (such as for textures). The voxels represent three dimensional pixels in space, allowing for the storing of simulation data such as velocity fields and collision fields, among others. Computation with sparse grids provides several advantages for fluid simulation. First, it reduces the storage of empty space not occupied by fluid. As simulations are considered that will be performed entirely in GPU memory this can be a significant factor in running large-scale simulations. Furthermore, with such voxels the grid size does not have to be pre-defined. As the fluid moves in space, new voxels can be allocated automatically as needed. Moreover, voxel data can be stored in three-dimensional (3D) textures as a collection of dense voxel groups (i.e., "bricks"), which allows fast data retrieval during computation and hardware-accelerated trilinear filtering. Further, neighbor lookups can be achieved with apron voxels to accelerate stencil operations on the GPU.

Figure 2:
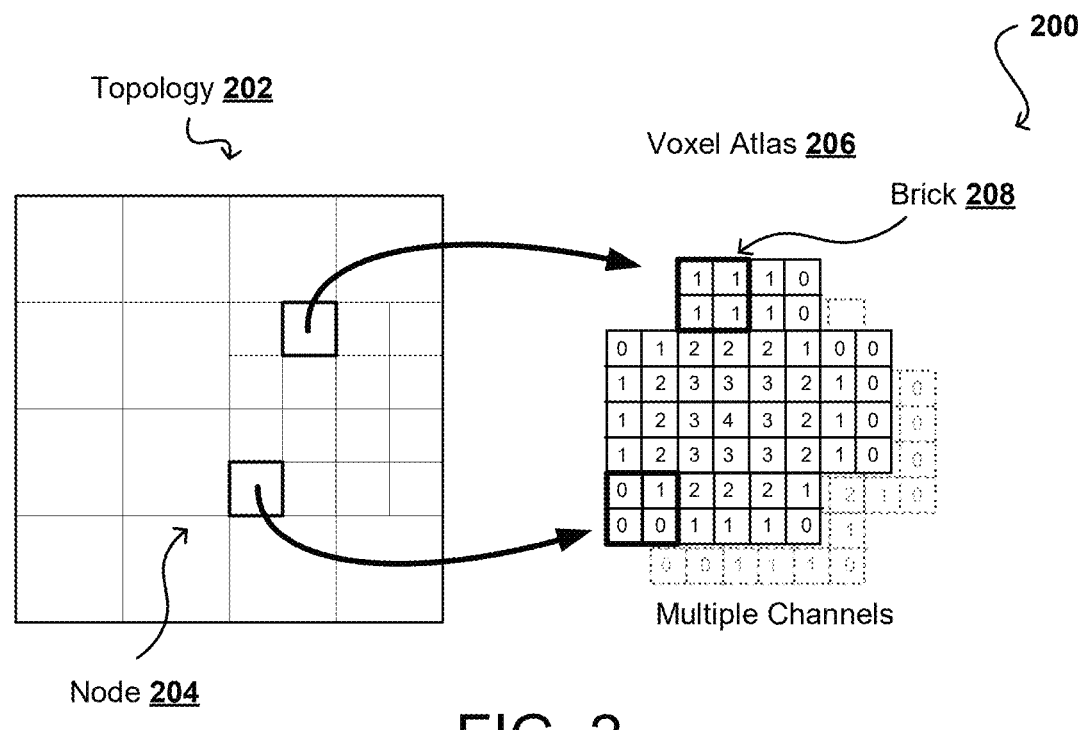
FIG. 2 illustrates an example topology storage approach that can be utilized in accordance with various embodiments.

Fluid simulation on sparse grids can involve a number of challenges. For example, the sparse structure in at least some instances must be rebuilt at every frame from a large number (e.g., tens of millions) of particles. Approaches in accordance with various embodiments can solve this, at least in part, by introducing an efficient algorithm for rebuilding and updating the tree topology. Particle-to-grid rasterization also presents performance challenges, which various embodiments address at least in part by introducing a parallel gathering method that efficiently utilizes GPU thread blocks and data coherence while keeping all computation on the GPU. Various embodiments can utilize a matrix-free conjugate gradient solver for sparse voxel grids to efficiently handle the pressure solver step of FLIP. If used together, the sparse grids and the matrix-free solver enable systems to support much larger volumes than previously achieved in GPU memory, while reaching orders of magnitude speedup compared to conventional dense, multi-core CPU implementations. Various embodiments utilize a fast dynamic hierarchical topology with incremental update, an efficient GPU-friendly sparse spatial division by subcells, and a fast FLIP simulation with accelerated particle-to-grid rasterization and a matrix-free conjugate gradient solver directly on sparse volumes. As an example, FIG. 2 illustrates an example storage approach 200 for data in GVDB voxels. The topology 202, including a set of nodes 204, is illustrated on the left is separated from the voxel data on the right of the figure, which includes a set of bricks to be stored. The voxel data is stored in voxel atlases 206 with three-dimensional textures. Multiple channels allow for per-voxel attribute storage.

As mentioned, fluid simulation using FLIP has been a popular approach since it was introduced to computer graphics, along with the particle-in-cell (PIC) method. Both PIC and FLIP use particles for advection with the pressure solve performed on the grid. FLIP addresses the numerical diffusion of PIC, but not numerical energy dissipation. Thus, back and forth error compensation and correction (BFECC) and the derivative particles methods can be used for reducing numerical dissipation when transferring data between particles and voxels. Researchers later improved the PIC/FLIP method by providing amplified splashing effects, accurate solid-fluid coupling, and proper air-liquid interfaces. Recently, affine particles were introduced to stably remove the dissipation problems of PIC, to provide exact conservation of angular momentum during particle-to-grid transfers. The Integrated Vorticity of Convective Kinematics (IVOCK) method was introduced for approximately restoring the dissipated vorticity during advection, independent of the advection method.

The PIC/FLIP method is not limited to simulating fluids, as its first use in computer graphics was in sand simulation and later to solving the internal pressure and frictional stresses in granular materials. PIC/FLIP is also used for handling hair collisions with itself and other objects. More recently, the Material Point Method (MPM), which adds elasticity forces to PIC/FLIP, was shown to handle simulations of various materials using a continuum formulation for effects such as snow, hyperelastic constitutive materials, sand, and materials with anisotropic elastoplasticity.

There is also an extensive amount of prior work on accelerating the PIC/FLIP method. The pressure solve on the grid, which involves solving the Poisson equation as a sparse linear system, is often the bottleneck of the PIC/FLIP approach. Decomposing and solving the pressure in parallel over sub-domains has received some attention. Other approaches use a low-resolution grid or a multigrid cycle as a preconditioner for a conjugate gradient solver. Instead of using uniform grids, tetrahedral discretization, far-field grids, and sparse uniform grids are used for aggressive adaptivity. Sparse volumetric structures were also used for reducing storage requirements. Recently, a topologically correct, boundary-conforming cut-cell mesh has been utilized to simulate liquid on very coarse grids, while a Schur-complement has also been presented for solving the Poisson equation on a decomposed domain in parallel.

In addition to pressure solve, other methods have been introduced to improve performance of the PIC/FLIP method. On approach involves computing an accurate level set representation in order to take large time steps. Rather than using eight particles per voxel, typical in FLIP, a proposal involved using only one particle per voxel with a larger particle radius to transfer particle velocities to the grid using a wider SPH-like kernel. A narrow band FLIP method was also introduced that can maintain particles within a narrow band of the liquid surface.

The computational power of GPUs has made them an attractive hardware solution for fluid simulation in general. As an example, Eulerian fluid simulation has been realized on the GPU with the iterative Jacobi method. Iterated Orthogonal Projections (IOP) have been utilized as an iterative multigrid-based Poisson solver on the GPU. Pre-simulated fire data on a coarse grid has been divided into 2D slices, and secondary Eulerian Navier-Stokes solvers performed in parallel across many separate GPUs. A specialized multigrid method has also been utilized for pressure projection on the GPU, along with a GPU-friendly sharpening filter that conserves mass locally and globally. A fixed-point method has also been utilized for accelerating Jacobi iterations for real-time simulations of paint on GPU.

As mentioned, various embodiments can take advantage of a framework such as the GVDB voxel framework. Such a framework can efficiently represent voxels on a sparse hierarchy of grids based on the work of GVDB. GVDB consists of a set of nodes stored in memory pools at multiple levels in a grid hierarchy, with rapid fan-out similar to B+ trees. A configuration vector identifies the resolution of each grid level as a vector of log 2 dimensions. For instance, the $\langle 2, 3, 4 \rangle$ configuration indicates a tree with three levels, having a root node with $(2^2)^3 = 64$ child nodes, intermediate nodes with $(2^3)^3 = 512$ child nodes, and leaf nodes referring to a dense brick of $(2^4)^3 = 4{,}096$ voxels. This configuration can address a volumetric domain of $(2^2 + 2^3 + 2^4)^3 \approx 134$ million voxels. GVDB Voxels allows for up to five level trees by default, giving a much larger address space.

GVDB Voxels can store topology data in two memory pools. The first pool, P0, is for common GVDB attributes for each node including position, parent index, bitmask (indicating which children are stored in the data structure), and an index to a list of children. The second pool, P1, maintains child lists for each node. For internal nodes, the child list consists of an index of nodes in P0 at the next lower level. Tree levels are numbered from root, highest, to leaf, lowest. Leaf nodes, level zero, have no children and instead maintain an index into a 3D texture atlas containing voxel bricks. GVDB Voxels can also implement apron voxels that duplicate the data storage for neighboring voxels. This allows for efficient access to neighboring data values without traversing the hierarchy, and is essential to efficient stencil operations during simulation.

The original GVDB data structure was designed to mimic the VDB approach, where bitmasks are used to compact child lists. In practice, storage of the topology is small (<1 MB) compared to the voxel atlas, and bitmask compaction complicates dynamic insertion and removal of nodes. GVDB Voxels can be modified to use explicit child lists for each node. Sparseness is still achieved since these lists only occur in occupied nodes. Such an implementation can remove the bitmask table and use a null value in P1 to indicate an inactive child node. Dynamic insertion and removal of children now are given by O(1).

Apron voxels can be stored with each brick to give rapid access to neighbors during simulation kernels. However, updating apron voxels is non-trivial. Since an apron update may be called repeatedly to maintain data consistency at brick boundaries, and can be used during the inner loop of a CG solver, performance can be critical in at least some embodiments. The previous technique launches three kernels along each axis. Approaches in accordance with various embodiments can instead launch a single kernel covering all six sides of a brick, including edges and corners, with one thread per apron voxel.

Simulation on a sparse data structure can require dynamic updates to track the fluid occupation. Embodiments can consider both full and incremental rebuild of a GVDB tree hierarchy, referred to as the data topology. An incremental update of moving particles can be at least an order of magnitude faster than full rebuild. The GVDB tree can be built from a large number of particles efficiently on the GPU. The GVDB configuration and the voxel size can be provided by the user. The number of GVDB levels needed can then be determined by the extent of the particle positions.

Figure 3:
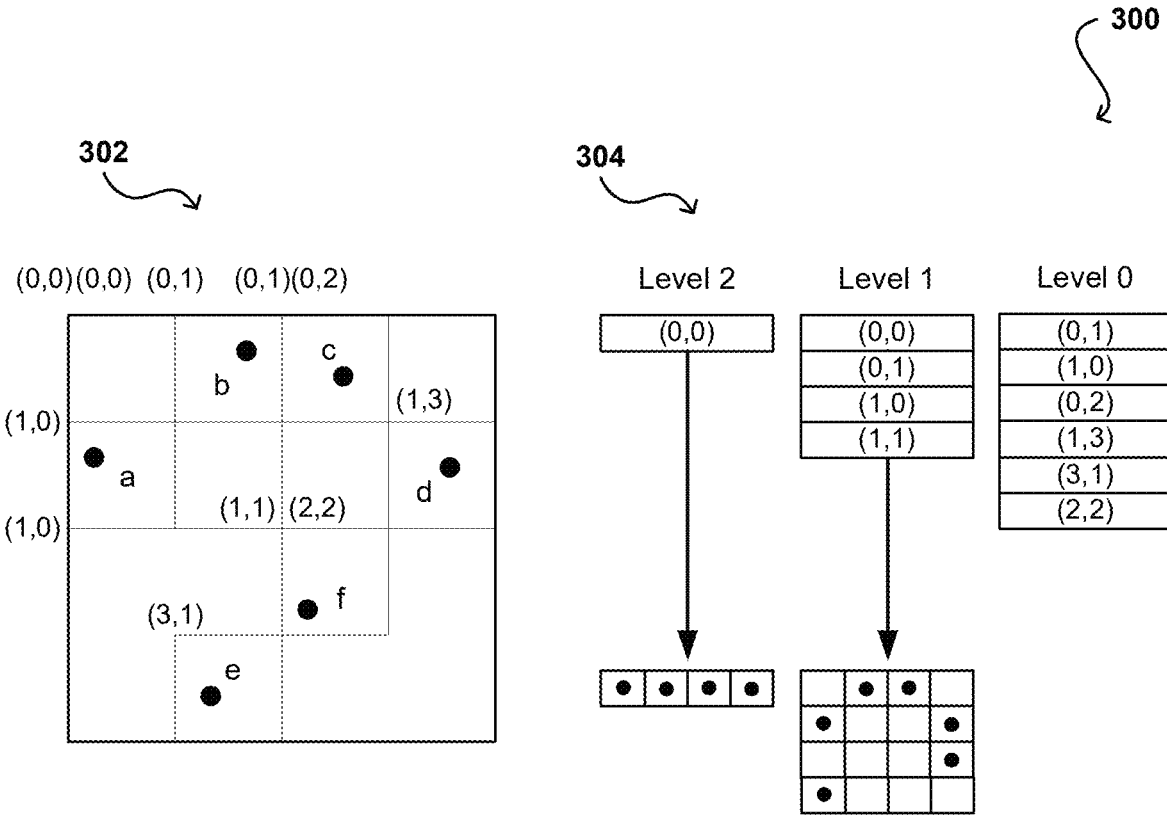
FIG. 3 illustrates an example approach to rebuilding a topology that can be utilized in accordance with various embodiments.

FIG. 3 illustrates and example approach 300 to performing a full topology rebuild. Given points a, b, c, d, e, and f, the goal can be to build a containing tree. The indexing positions of the GVDB nodes are on the top-left of the node 302. After converting points to a list of keys $\langle \ell x, y, z \rangle$, a radix soft can be used to sort all levels simultaneously. Each value can be checked with the previous one. If so, set 0 in the marker list, otherwise set 1. Then, generate prefix sum for the marker list. Finally, by reading the marker list, if the value is 1, the value can be read from the sorted list and written to the compact list as the position from the prefix sum. The GVDB topology 304 with two memory pools is then created. It should be noted that dotted blocks in P1 in the figure store the children node addresses and empty blocks are filled with a value of −1.

An approach to parallel topology construction in accordance with one embodiment involves generating a list of tree nodes overlapping particles at all levels simultaneously, then sorting and removing duplicates to determine the minimal set of nodes to be added to the tree hierarchy. A first step topology rebuild is to determine the number of tree levels L. The bounding box can be computed that contains all particles, which determines the level L of the root node required to contain all particles. The bounding box is computed by a parallel GPU reduction algorithm. A node-index list can then be generated. A node-index list can be defined to consist of the indices of tree nodes that contain each particle at every level of the hierarchy. Let n be the number of particles. The total size of this list is nL, and it can be generated with a single pass over all particles. The three indices x, y, and z of a node that contains a particle at level $\ell$ are determined from the particle position. For each level $\ell$, where $0 \le \ell \le L-1$, a single concatenated integer value $\langle \ell, x, y, z \rangle$ is written to the list. Note that a GVDB configuration with less than $(2^8)^3$ leaf nodes would need no more than 8 bits for indices x, y, and z, so the value $\langle \ell, x, y, z \rangle$ can be stored as a 64-bit integer.

The node-index list can then be compacted. The node-index list generated in the previous step can contain many duplicated values, since each node could typically contain many particles. This list can be compacted by eliminating the duplicated values. This step begins with a sort such as a Radix sort, which can sort the entire list in a few passes (i.e., four passes in one embodiment). Then, with an additional pass over the sorted node-index list, elements can be marked that are different than their preceding neighbor. A final pass can copy the marked elements into a compacted list. Each value in the compacted list may then correspond to a unique tree node that must be added to the topology to cover all particles. The nodes can then be allocated and initialized. In one embodiment the two memory pools of GVDB are allocated based on the size of the compacted node-index lists. Then, the node data is initialized by assigning the level and position values of each node. All child-node indices are initialized to a null value. The child node lists can then be set, and the child node indices set in multiple passes. Starting from level L−1, right below the root node, each pass can launch a CUDA kernel for each node of a level. For each node, its parent node can be found by traversing the data structure starting from the root node, and the child node pointer of the parent to the node. Once all nodes at all levels are processed, the GVDB structure contains the correct child node indices for all existing nodes.

In at least one embodiment there can be a second pass for an influencing box. Voxels exist to cover up to a unit edge distance for particle-to-grid velocity transfers, or two times the radius to generate level sets (for rendering). This bounding box per particle is referred to herein as the influence box. The first pass generates GVDB nodes which cover particle centers. While it is possible to modify the first pass to extend the node-index list to cover the influence box, this naïve modification would produce a node-list eight times larger or more. The second pass is used to quickly generate neighboring bricks touched by influencing boxes. A goal of this second pass is to generate the relatively few voxel bricks that do not yet exist in the tree, do not contain particle centers, but are required due to the influence box of the particles. For the second pass, the second step of the first pass can be modified such that only missing nodes are added to the list using atomic indices. Thus, a much shorter list should be generated compared to the first pass. Since duplicate nodes may still be included, the third step can still be performed to compact this extended node-index list. Steps four and five can be identical to the first pass in at least some embodiments.

The tree topology for two consecutive time steps of a FLIP simulation will be very similar even with large time steps. Therefore, incremental updates can be performed rather than rebuilding the topology from scratch. Typically, at each step, only a relatively small a relatively small number of new nodes and voxels need to be allocated, and a small portion of existing nodes are no longer needed. Therefore incremental updates can be performed much more efficiently than complete reconstruction of the topology. An incremental rebuild in accordance with various embodiments can be somewhat similar to a full topology construction algorithm. A significant difference resides in the second step that generates the node-index list. The desired incremental list may be the subset of the full node list, which only contains new nodes not already in the existing GVDB tree. Thus, for each particle, each corner of the influencing bounding box for the particle can be checked to determine whether there already exists a node at that level. If so, mark the node; otherwise, $\langle \ell, x, y, z \rangle$ is added to the new node list.

Steps three through five operate similarly in at least some embodiments. If an existing node is marked during the second step, the node is no longer needed and can be safely removed from the tree. These nodes can be removed with an additional step, using multiple passes in a bottom-up order. The unmarked nodes can be removed by setting the corresponding child node indices of parent nodes to a null value. Removed nodes and their bricks are de-referenced but not deleted from memory pools, allowing them to be reused for new bricks which are relinked on each frame.

Approaches in accordance with various embodiments can utilize subcells. Subcells can be used to spatially divide each voxel storage brick, or other such data grouping, into multiple, small sub-volumes organized for specific types of processing hardware (e.g., GPU hardware). Particle position and velocity lists can then be created to store all particles belonging to, or overlapping, each subcell. The optimal size of a voxel brick can depend at least in part upon the application, with tradeoffs between performance and occupancy. Whereas large bricks are ideally suited for disk input/output (I/O) operations and raytracing, the number of voxels-per-brick typically exceeds a GPU thread block, making local computation inefficient. Therefore the GVDB Voxel bricks can be retained for storage, with subcells being used to create a logical grouping for thread blocks. Subcells can be used to organize a given geometry (e.g., points, polygons) for computation with respect to a set of voxels. In at least some embodiments, subcells are determined and discarded for every frame (or other simulation time step). For a given frame, the subcells are determined, particles are assigned using a prefix sum, and the appropriate calculations are performed for that time step. Bricks, on the other hand, are maintained over time. The bricks represent static coordinates that may turn on or off over time.

The total memory consumed in this approach is the union of particles in every subcell, including duplicates that overlap other subcells. At one extreme, if a subcell is only one voxel ($1^3$), each subcell correspond to the ideal list of particles impacting that voxel. However, the total list length will be much longer than the original particle list. With larger subcells, more unnecessary particles are checked per subcell, but the total list length will be shorter. One embodiment can utilize $4^3=64$ voxels per subcell as an even multiple of CUDA warps (i.e., 32× threads) and to balance search length with memory consumption while also fitting into a single GPU thread block (512× threads). A warp is a set of 32 threads within a thread block, where all threads in a warp execute the same instruction. To improve hardware coherence, instead of storing particle indices, the positions and velocities are copied into each subcell. Due to duplication in the lists caused by overlaps the subcell list occupies the most memory during simulation. To further reduce memory usage, position and velocity can be compacted by encoding them as 16-bit ushort values (or values of an unsigned short type), dividing by their range and using half as much memory overall.

Figure 4:
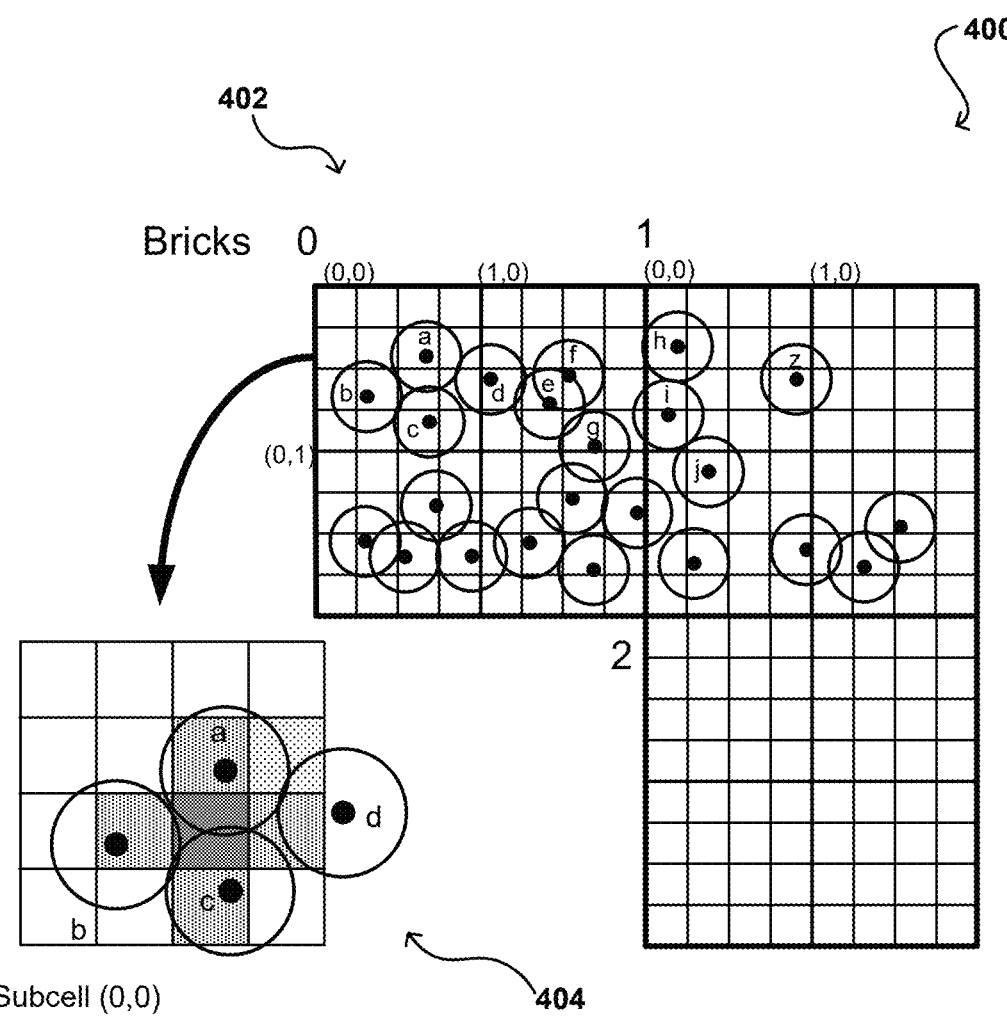
FIG. 4 illustrates an example subcell division approach that can be utilized in accordance with various embodiments.

FIG. 4 illustrates an example approach 400 to subcell division that can be utilized in accordance with various embodiments. In this example, the subcells 404 are illustrated as a logical subdivision of voxel bricks 402 into computational units. As mentioned, the subcells provide a logical division of the space that maps well to specific hardware. While bricks organize the sparse domain, and are sized for global performance of raytracing and I/O, they contain too many voxels for efficient GPU compute. Subcells are 64 voxels, sized to fit into a GPU thread block and an even multiple of CUDA warps as discussed above. Every voxel in a subcell shares the same subcell particle list. This can require duplication as, for example, particle d exists in subcells 0,0 and 1,0, but reduces the search length per voxel. During construction, the covered subcells of a particle are determined by rasterizing the influence box for the particle.

A flip simulation in accordance with various embodiments can thus utilize four distinct steps for each time step. These can include building the GVDB structure from particles, rasterizing particle attributes to voxels, solving fluid dynamics on the sparse grid, and updating particle data for advection. A GPU-based simulation can make use of GVDB Voxels to efficiently represent only the volume occupied by liquid, thereby reducing memory and enabling larger simulations. Subcell division of bricks can be used to accelerate voxel and particle operations.

A FLIP-style simulation in accordance with various embodiments can involve transferring particle velocities to the voxel grid. The weighted sum of nearest particles can contribute to any given voxel. This can be performed as a scatter or as a gather in various embodiments. Gathering can offer several benefits on the GPU in this context. Since the GVDB data is stored in a texture atlas, gathering can avoid parallel texture write conflicts. A naive gather technique might check the distance of each voxel to every particle. Such an approach would be impractical with millions of particles. The subcell division of particles into voxel groups, described earlier, is a valuable layout for efficient gathering of particles to voxels. A kernel can be launched for every active voxel, with each subcell as a GPU grid block. A typical gather accesses each particle once to perform a sum of some attribute. Several rasterization kernels can be implemented to gather velocity and density to generate level set values for rendering. Additionally, many gather operations, such as velocity and fluid-air markers, can be combined in a single kernel.

A pressure solve is an important component of an incompressible fluid simulation in at least some embodiments. A goal of such an approach is to solve the linear system Ax=b, where x is unknown pressure, b is divergence, and A is a sparse matrix that only depends on voxels properties, which can be solid, fluid, or empty. The matrix A is the seven-point Laplacian matrix in at least some embodiments. Since matrix A is symmetric positive definite, the Conjugate Gradient (CG) algorithm may be appropriate. Approaches in accordance with various embodiments utilize a parallel, matrix-free CG solver for FLIP simulation on sparse voxel grids residing directly on a sparse tree hierarchy. Computing the conjugate gradient without storing the matrix can provide for high accuracy while avoiding memory bottlenecks or limitations for large systems. It should further be noted that there are at least two types of sparse, including spatially spare and matrix sparse. Even if spatially sparse data is not included in the voxels, there may still be a very large matrix that is matrix sparse, and which may only have near-diagonal elements in some instances. Thus, instead of storing data for the sparse matrix, the conjugate gradient solver can look up the matrix values dynamically as needed.

An expensive operation in the CG solver involves sparse matrix-vector multiplication (SpMV). The matrix A is a 2D dimensional matrix of size $N^3 \times N^3$, where N is the total number of active fluid voxels, thus growing rapidly with grid resolution. Even with sparse matrix libraries, the matrix would quickly consume GPU memory for large systems. Therefore, following a matrix-free approach, storing the matrix A can be avoided by constructing matrix values from voxels directly as needed on-the-fly. Each row of matrix A corresponds to one pressure equation, in which only seven entries are non-zero at maximum. The diagonal value corresponds to the number of non-solid neighboring voxels and the other six values depend on the six neighboring voxel properties. Due to apron voxels collocated with bricks, immediate neighbors can be accessed as direct texture fetches without tree traversal.

GVDB Voxels provides channels that can be used to store per-voxel component data, and data used by the CG solver can be stored as channels in separate 3D textures. Those channels are referred to herein as vectors, at least when referring to the solver. Since GVDB is a sparse structure, each channel covers the active fluid voxels without storing the entire domain. For SpMV, one thread per voxel is launched and six neighboring voxel values are checked to compute the inner product between the input vector and the row of matrix A. The result can then be written to the output vector directly. For instance, to compute the matrix-vector multiplication of A with vector b at row i, the six neighbors of voxel i (x, y, z) can be examined to retrieve scalars $s_0$, $s_1$, $s_2$, $s_3$, $s_4$, and $s_5$ on voxels (x+1, y, z), (x, y+1, z), (x, y, z+1), (x−1, y,z), (x, y−1,z), and (x, y,z−1). Note that due to apron voxels, neighbors are already available in GPU texture cache (and shared memory via GVDB macros) co-located in the same brick as voxel i. For the result vector c, $$c_i = bi \sum_0^5 s_n - \sum_0^5 \cdot b_n s_n$$

can be computed. While mapping between world space and atlas space can be performed in constant time with GVDB helper functions, since CG solver operations only require neighbor locality these kernels can be launched directly in atlas space. Result values are written directly to another output channel.

Figure 5:
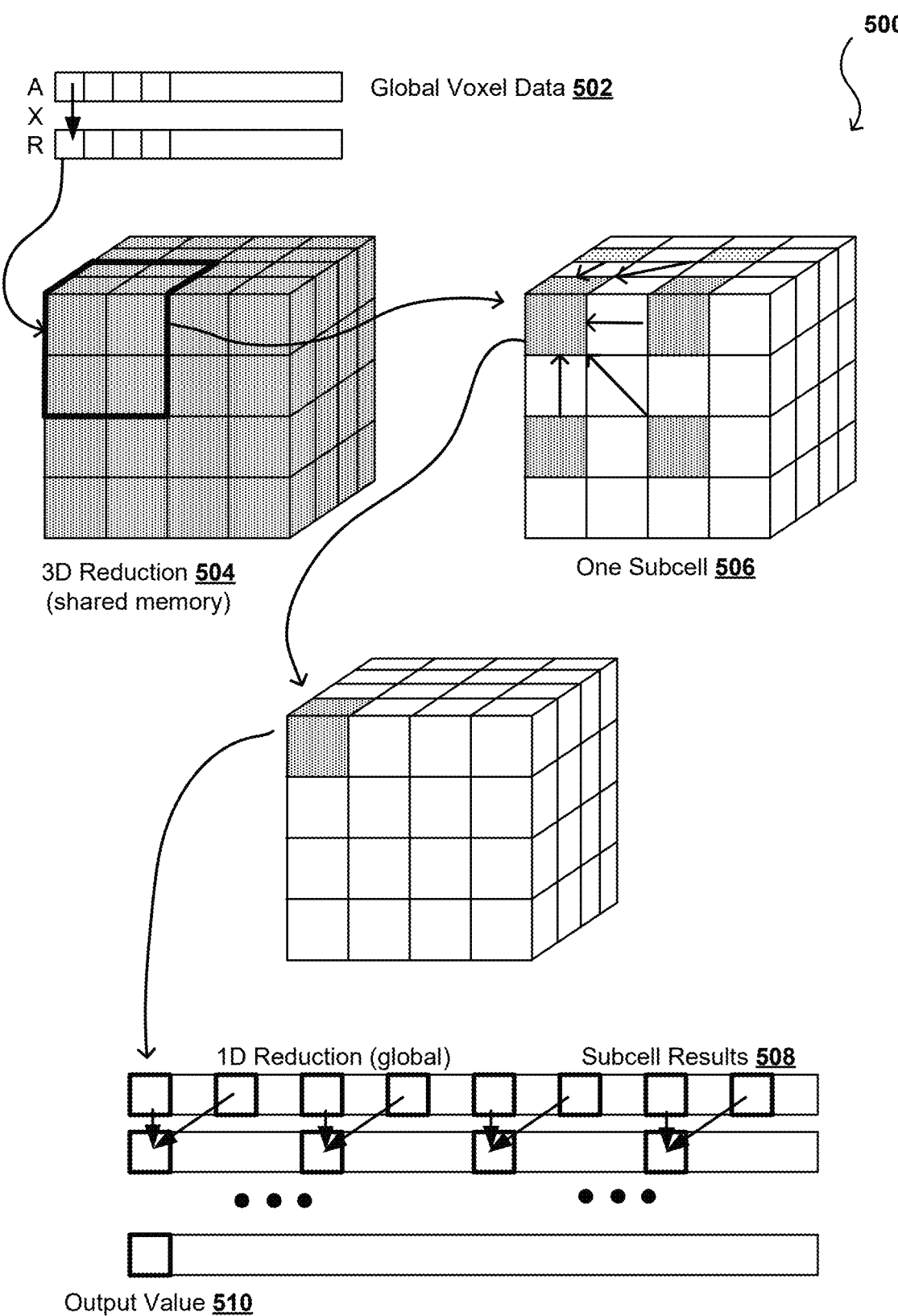
FIG. 5 illustrates an example inner product by reduction of a data volume that can be performed in accordance with various embodiments.

Vector addition can be relatively straightforward using GVDB channels, but the inner product of two vectors, used for computing the residual in the CG solver, may involve a complicated operation. For the inner product of global voxel data 502 for two channels, a three dimensional parallel reduction can be performed, such as is illustrated in the example approach 500 of FIG. 5. Given vector a and b in one subcell, each thread multiplies $a_i$ with $b_i$ and writes to $4^3$ shared memory. Then, a 3D reduction 504 can be performed in shared memory. Each sub-group of eight voxels can be reduced to one value of a subcell 506 on each iteration. The 3D reduction step can result in one accumulated value written to a global 2D array. The final step performs a similar reduction to a 1D array reduction on the results 508 of each subcell to get the final output product value 510.

Each CG iteration can require one SpMV in at least some embodiments, as well as two inner products, three vector additions, and one apron update to maintain neighbor voxels. Finally, after each CG iteration, the residual norm can be read back to the CPU to check the solver termination criteria. To reduce pipeline stalls and maintain performance, this check can be performed regularly, such as for every ten iterations. Final advection is a straight forward sampling of the voxel data at particle locations. Corresponding to the FLIP technique, the old and new grid velocities can be sampled and subtracted to give the new particle velocity. Hardware interpolation can be supported by GVDB Voxels to retrieve velocity values at arbitrary positions.

Results of approaches in accordance with various embodiments have demonstrated greatly improved simulation times compared to CPU implementations of FLIP. Tests were performed on a variety of scenes at different scales, with performance being measured for topology re-build, simulation experiments on both GPU and CPU, and memory usage. Full topology re-build on GPU is 7-20× faster than CPU rebuild, and incremental rebuild is from 80-180× faster than the original CPU rebuild. More importantly, incremental topology update requires less than 2% memory usage as compared to full topology build on the GPU, since the update lists are much smaller. Therefore, in the performed simulations, a full GPU topology build is used in the first frame, and the memory is released and made available for later operations, allowing for larger simulations.

The performance of an example FLIP simulation on the GPU can be compared to two different conventional multi-threaded CPU implementations. The first one includes a similar CG solver, and the second uses an incomplete cholesky preconditioner for improved performance (PCG), while both work on a dense grid with multiple CPU cores. These solvers were tested on two relatively simple scenes, using different grid sizes and particle counts. A projection step in accordance with one embodiment is orders of magnitude faster than the CPU-based dense CG solver. Note that $1e^{-4}$ is used as the CG tolerance for all tests. Even compared with PCG CPU, which requires one third the iterations, a method in accordance with one embodiment is still 10× to 28× faster. Preconditioners suitable for parallel hardware may further improve performance for at least some use cases.

By using an incremental method in accordance with various embodiments, the time for topology construction is less than 3% of the total time. The CG solver may still be the most time-intensive part, requiring kernel launches for SpMV, two inner products, three vector additions, and an update apron for each iteration. With hardware trilinear interpolation, the final advection step takes around 1% of the total time. Performance was found to depend highly on the distribution of particles in space. When water splashes and scatters more bricks are required, the ratio of unused (air) to occupied (fluid) voxels can be increased. As long as there is one fluid voxel inside a brick, all voxels in the brick may need to be processed. This can be alleviated somewhat by reducing the GVDB brick size at the expense of increased topology rebuild and update time. Collisions with obstacles can be handled by voxelization of polygonal obstacle models into a separate GVDB object, thus effectively utilizing a different sparse grid for collision models. While collisions with detailed, static models have been demonstrated, rigid moving objects could be handled simply by updating the model transform (frame of reference) of the collision grid without revoxelization.

Peak memory usage was measured for an example simulation, which determines the size of simulations that can be handled on the GPU. As described previously, subcell lists can occupy substantial memory during simulation. Another substantial usage of memory can be the voxel channel data. All voxel data can be stored in a number of channels, such as thirteen GVDB channels: density, fluid markers, new and old velocity components at x, y, and z direction, divergence, pressure, and two extra channels for vectors used by the CG solver. Although a single channel is relatively small, for a 20 million particle scene, all 13 channels can take nearly half of the simulation memory. Channel data is stored in 3D textures that dynamically resize to assign bricks covering the fluid.

Full topology build requires a long node-index list for sorting, as well as another list of the same length to store the sorting result, marker list, and prefix sum list. However, the temporary memory can be released after a full topology build and used for another purpose such as GVDB channel data. The sorted node-index list, marker list, and prefix sum lists can be resized as needed, but it may be undesirable to resize the node-index list since it would require an additional pass to compute list length, lowering performance, while it is not the primary memory bottleneck. It should be noted that full topology build can require twice the amount of memory with respect to incremental topology, but the actually usage of incremental topology update is less than 2% of full rebuild.

Approaches in accordance with various embodiments can thus provide for an efficient GPU-based FLIP simulation for fluids on sparse, virtually unbounded domains. Approaches can build a sparse tree topology, incrementally update the tree, efficiently sort particles into subcells, and perform the FLIP simulation steps with a fast, matrix-free Conjugate Gradient solver over millions of particles. Overall simulation times can be achieved that are orders of magnitude faster than similar CPU-based solutions. A matrix-free CG solver can also be used in some embodiments, which can operate on sparsely-placed bricks and that is optimized for GPU hardware. In at least some embodiments, a matrix-free approach can work efficiently because the apron contains items one step further, or outside of the 32×32×32 voxel. If ever the computation was required to fetch an item at +2 steps outside of the voxel, however, then a fetch may be required to read the value to the voxel located aside, as the apron (cached in the texture) will not tore that item in at least some instances. Thus, a matrix-free approach may work efficiently because most of sparse-matrix operations only need the direct neighbors. Rather than storing the sparse matrix A, voxel values can be examined directly as needed on-the-fly, greatly reducing memory usage and enabling much larger simulations in GPU memory. Accelerated solver operations include fast 3D reduction for inner products, efficient apron updates for neighbors, and hardware interpolated particle advection. An example system can simulate up to 74 million particles with a few seconds per frame on modern GPU hardware.

In some embodiments, a GPU-friendly pre-conditioner, such as a multi-grid technique similar, can be implemented on a sparse domain. In other embodiments, narrow band FLIP can be implemented to reduce the number of particles, as particle insertion and sorting into subcells is the highest performance cost in some approaches. In still other embodiments, the GVDB topology is naturally suited to an out-of-core approach as the space can be divided along tree boundaries. Each of these options can be implemented using efficient GPU-based voxel computation with subcells. In some embodiments a Data Parallel Primitives library (cuDPP) can be utilized for radix sort and bounding box reduction, and providing improved performance with custom kernels and memory handling. Other approaches can be utilized as well in other embodiments, as would be apparent to one of ordinary skill in the art in light of the teachings and suggestions contained herein. A counting step could be utilized to pre-allocate the required: memory for the first full topology rebuild, further reducing memory usage. Rigid bodies and level sets for collisions could be moved.

There can be applications of various subcells, formed using approaches discussed herein, that do not involve simulation. This can include, for example, the use of Voronoi partitioning. A Voronoi approach in accordance with various embodiments can be used as an application of subdivision, but is a procedural approach that is optimized using subcells. Voronoi partitioning essentially subdivides a volume, plane, or other such space into regions based on distance to points in a specific subset. For each "seed" point of the subdivision there is a corresponding region (or Voronoi cell) consisting of points that are closer to that seed point than other seed points in the space.

In one example, Voronoi partitioning can be used for applications such as 3D printing. NVIDIA GVDB Voxels is well-suited for 3D Printing design, prototyping and embedded applications where both performance and memory footprint are critical. Voxels provide a desirable approach to the 3D Printing workflow as they represent complex, connected microstructures and heterogeneous materials more easily than polygons. Supporting very high resolution volumes with massive parallelism on GPUs, the sparse data structure of NVIDIA GVDB Voxels allows for geometric operations, simulation and rendering of complex models with fine detail GVDB Voxels, as mentioned elsewhere herein, is well-suited as core representation for 3D Printing Design applications, Generative Design, Process Engineering, Materials Simulation or print PreVisualization. For 3D printing in accordance with one embodiment, an interactive generation of a Voronoi foam can be performed for infilling using NVIDIA GVDB Voxels. Voronoi structures can be generated at 200 milliseconds for a $1024^3$ effective volume. Rendering can be performed interactively, such as with OptiX integration, for high quality, real-time part previsualization. Variations in the infilling structures can be generated interactively, such as in response to simulated part strains and user manipulation. Generated structures can respond dynamically to desired changes in foam density. The output data can be directly used in slice-based printing.

Such approaches can be highly efficient, allowing for the regeneration of entire models in less than a second In conventional 3D printing approaches, it may take a minute or more to calculate the slices needed for infilling. In some embodiments, the inputs include the model and the solid interior, along with the density field which can be a GVDB voxel field in some embodiments. Similar to approaches discussed above, there can be a series of steps. The inputs are obtained, including the model and the density field, which determines how points of the point cloud are to be distributed. The Voronoi function can then be determined for that point cloud. Points interior to the model can have different density load distributions, and the procedure can determine where the voxels need to be activated or deactivated in order to create the correct boundaries between points of the cloud. Subcell division is used to efficiently compute which of the neighbors are needed to contribute to a particular Voronoi cell. Spreading points in various densities for Voronoi regions also allows for optimization of the consumption of the material (e.g., plastic or other) used to create a part, while keeping the proper resistance to any sort of pressure/ tension. It could also make the 3D printed part lighter while still strong enough for its intended or eventual purpose.

FIG. 6 illustrates an example process 600 for performing a simulation that can be utilized in accordance with various embodiments. It should be understood for this and other processes discussed herein that there can be additional, alternative, or fewer steps performed in similar or alternative orders, or in parallel, within the scope of the various embodiments unless otherwise stated. Further, although fluid simulations are utilized as a primary use case for description purposes, various other simulations and applications can take advantage of aspects of the various embodiments as discussed and suggested herein. In this example, a particle simulation to be performed is determined 602. This can include, for example, determining a fluid simulation to be performed as part of a computer graphics application, among other such options. A set of objects and parameters can be determined 604 for the simulation. This can include, for example, objects with which the fluid may interact, properties for the fluid or fluid particles, limits on the simulation, and other such aspects. The topology for the simulation can then be allocated 606 to a hierarchical tree for a sparse volume, as much of the volume will not have active fluid particles during the simulation. The leaf nodes of the tree can correspond to bricks of voxels as discussed herein. For the simulation, the bricks of voxels can be spatially divided 608 into subcells sized for processing hardware, such as for GPU threads. The particle simulation can then be performed 610. The performance can include projecting behavior information for the individual subcells of voxels, where that behavior information can relate to the velocity and/or density information for the various subcells, as may relate to an average or other measure of the particles within a particular subcell. Various other types of behavior information can be determined and projected as well, as may depend at least in part upon the type of simulation. For a graphics application, the process can continue and new subcells can be determined for each frame. Once the simulation has completed, the results of the simulation can be provided 612, such as may be used for rendering a scene of computer graphics as discussed herein. As mentioned, a subcell division of particles into voxel groups is a valuable layout for efficient gathering of particles to voxels. A kernel can be launched for every active voxel, with each subcell as a GPU grid block. A typical gather can access each particle once to perform a sum of some attribute. Several kernels can be implemented to gather velocity and density to generate level set values for rendering. Additionally, many gather operations, such as velocity and fluid-air markers, can be combined in a single kernel.

FIG. 7 illustrates another example process 700 for performing a simulation that can be utilized in accordance with various embodiments. In this example, a particle simulation to be performed is determined 702, and a set of objects and parameters determined 704, such as is discussed with respect to FIG. 6. As mentioned, a pressure solve can be an important component of an incompressible fluid simulation in at least some embodiments. The topology for the simulation can then be allocated 706 to a hierarchical tree for a sparse volume, as much of the volume will not have active fluid particles during the simulation. The leaf nodes of the tree can correspond to bricks of voxels as discussed herein. For the simulation, a set of vectors can be generated 708 that include voxel data from the sparse volume, with the set excluding zero value elements. The particle simulation can then be performed 710. The performance can include computing other parameters on the sparse gradient, as may include the conjugate gradient. Once the simulation has completed, the results of the simulation can be provided 712, such as may be used for rendering a scene of computer graphics as discussed herein.

As mentioned, a goal of such an approach is to solve a linear system involving the pressure, divergence, and a sparse matrix that depends only on voxels properties. A Conjugate Gradient (CG) solver can be used since the matrix is symmetric positive definite in various embodiments. Approaches in accordance with various embodiments utilize a parallel, matrix-free CG solver for FLIP simulation on sparse voxel grids residing directly on a sparse tree hierarchy. Computing the conjugate gradient without storing the matrix can provide for high accuracy while avoiding memory bottlenecks or limitations for large systems. Instead of storing data for the sparse matrix, the conjugate gradient solver can look up the matrix values dynamically as needed.

Figure 8:
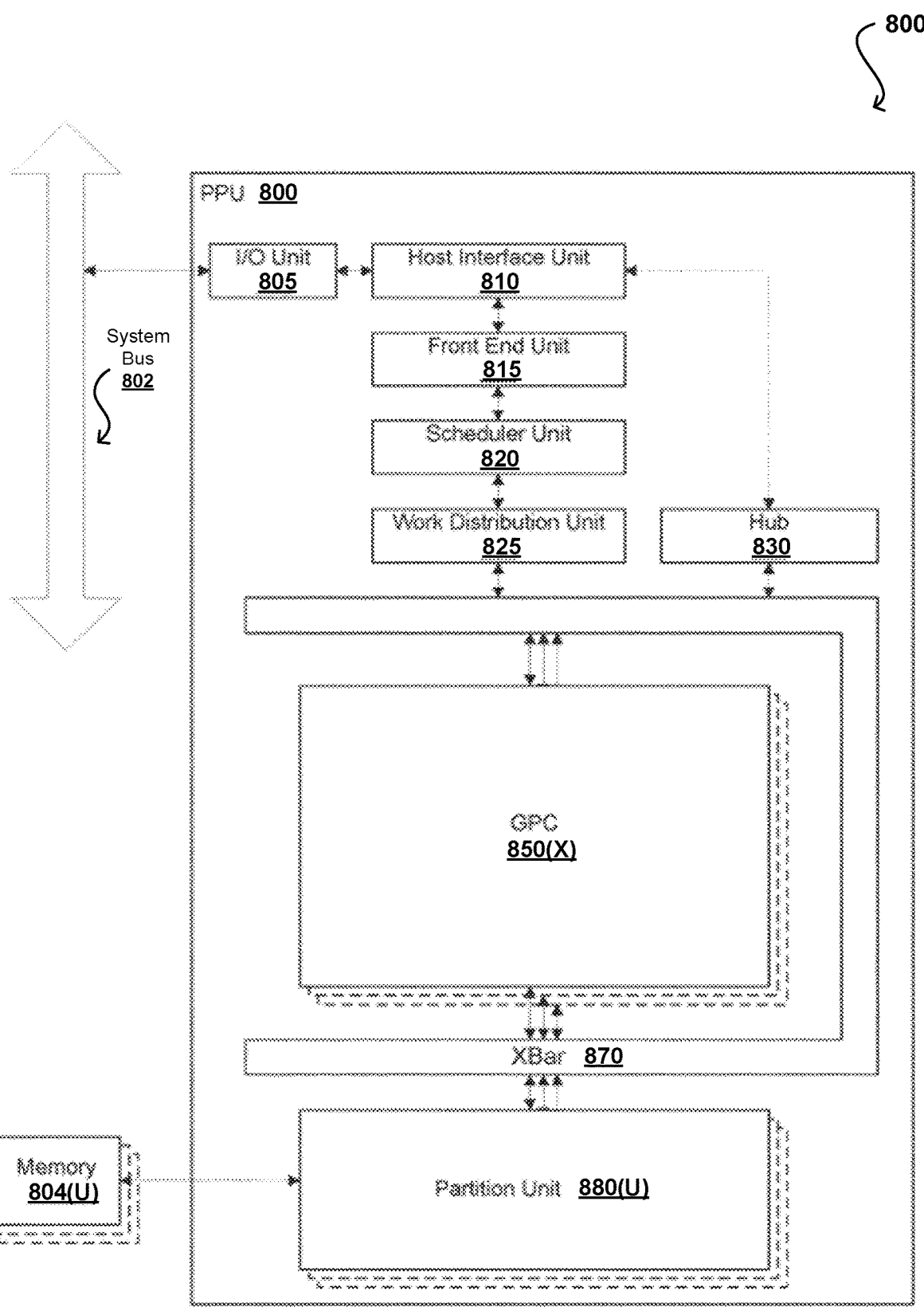
FIG. 8 illustrates an example parallel processing unit (PPU) 800 that can be utilized in accordance with various embodiments.

FIG. 8 illustrates a parallel processing unit (PPU) 800, in accordance with one embodiment In one embodiment, the PPU 800 is a multi-threaded processor that is implemented on one or more integrated circuit devices. The PPU 800 is a latency hiding architecture designed to process a large number of threads in parallel. A thread (i.e., a thread of execution) is an instantiation of a set of instructions configured to be executed by the PPU 800. In one embodiment, the PPU 800 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 800 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

As shown in FIG. 8, the PPU 800 includes an Input/ Output (I/O) unit 805, a host interface unit 810, a front end unit 815, a scheduler unit 820, a work distribution unit 825, a hub 830, a crossbar (Xbar) 870, one or more general processing clusters (GPCs) 850, and one or more partition units 880. The PPU 800 may be connected to a host processor or other peripheral devices via a system bus 802. The PPU 800 may also be connected to a local memory comprising a number of memory devices 804. In one embodiment, the local memory may comprise a number of dynamic random access memory (DRAM) devices.

The I/O unit 805 is configured to transmit and receive communications (i.e., commands, data, etc.) from a host processor (not shown) over the system bus 802. The I/O unit 805 may communicate with the host processor directly via the system bus 802 or through one or more intermediate devices such as a memory bridge. In one embodiment, the I/O unit 805 implements a Peripheral Component Interconnect Express (PCIe) interface for communications over a PCIe bus. In alternative embodiments, the I/O unit 805 may implement other types of well-known interfaces for communicating with external devices.

The I/O unit 805 is coupled to a host interface unit 810 that decodes packets received via the system bus 802. In one embodiment, the packets represent commands configured to cause the PPU 800 to perform various operations. The host interface unit 810 transmits the decoded commands to various other units of the PPU 800 as the commands may specify. For example, some commands may be transmitted to the front end unit 815. Other commands may be transmitted to the hub 830 or other units of the PPU 800 such as one or more copy engines, a video encoder, a video decoder, a power management unit, etc. (not explicitly shown). In other words, the host interface unit 810 is configured to route communications between and among the various logical units of the PPU 800.

In one embodiment, a program executed by the host processor encodes a command stream in a buffer that provides workloads to the PPU 800 for processing. A workload may comprise a number of instructions and data to be processed by those instructions. The buffer is a region in a memory that is accessible (i.e., read/write) by both the host processor and the PPU 800. For example, the host interface unit 810 may be configured to access the buffer in a system memory connected to the system bus 802 via memory requests transmitted over the system bus 802 by the I/O unit 805. In one embodiment, the host processor writes the command stream to the buffer and then transmits a pointer to the start of the command stream to the PPU 800. The host interface unit 810 provides the front end unit 815 with pointers to one or more command streams. The front end unit 815 manages the one or more streams, reading commands from the streams and forwarding commands to the various units of the PPU 800.

The front end unit 815 is coupled to a scheduler unit 820 that configures the various GPCs 850 to process tasks defined by the one or more streams. The scheduler unit 820 is configured to track state information related to the various tasks managed by the scheduler unit 820. The state may indicate which GPC 850 a task is assigned to, whether the task is active or inactive, a priority level associated with the task, and so forth. The scheduler unit 820 manages the execution of a plurality of tasks on the one or more GPCs 850.

The scheduler unit 820 is coupled to a work distribution unit 825 that is configured to dispatch tasks for execution on the GPCs 850. The work distribution unit 825 may track a number of scheduled tasks received from the scheduler unit 820. In one embodiment, the work distribution unit 825 manages a pending task pool and an active task pool for each of the GPCs 850. The pending task pool may comprise a number of slots (e.g., 16 slots) that contain tasks assigned to be processed by a particular GPC 850. The active task pool may comprise a number of slots (e.g., 4 slots) for tasks that are actively being processed by the GPCs 850. As a GPC 850 finishes the execution of a task, that task is evicted from the active task pool for the GPC 850 and one of the other tasks from the pending task pool is selected and scheduled for execution on the GPC 850. If an active task has been idle on the GPC 850, such as while waiting for a data dependency to be resolved, then the active task may be evicted from the GPC 850 and returned to the pending task pool while another task in the pending task pool is selected and scheduled for execution on the GPC 850.

The work distribution unit 825 communicates with the one or more GPCs 850 via a XBar 870. The XBar 870 is an interconnect network that couples many of the units of the PPU 800 to other units of the PPU 800. For example, the XBar 870 may be configured to couple the work distribution unit 825 to a particular GPC 850. Although not shown explicitly, one or more other units of the PPU 800 are coupled to the host unit 810. The other units may also be connected to the XBar 870 via a hub 830.

The tasks are managed by the scheduler unit 820 and dispatched to a GPC 850 by the work distribution unit 825. The GPC 850 is configured to process the task and generate results. The results may be consumed by other tasks within the GPC 850, routed to a different GPC 850 via the XBar 870, or stored in the memory 804. The results can be written to the memory 804 via the partition units 880, which implement a memory interface for reading and writing data to/from the memory 804. In one embodiment, the PPU 800 includes a number U of partition units 880 that is equal to the number of separate and distinct memory devices 804 coupled to the PPU 800. A partition unit 880 will be described in more detail below in conjunction with FIG. 9B.

In one embodiment, a host processor executes a driver kernel that implements an application programming interface (API) that enables one or more applications executing on the host processor to schedule operations for execution on the PPU 800. An application may generate instructions (i.e., API calls) that cause the driver kernel to generate one or more tasks for execution by the PPU 800. The driver kernel outputs tasks to one or more streams being processed by the PPU 800. Each task may comprise one or more groups of related threads, referred to herein as a warp. A thread block may refer to a plurality of groups of threads including instructions to perform the task. Threads in the same group of threads may exchange data through shared memory. In one embodiment, a group of threads comprises 32 related threads.

FIG. 9A illustrates a GPC 850 of the PPU 800 of FIG. 8, in accordance with one embodiment. As shown in FIG. 9A, each GPC 850 includes a number of hardware units for processing tasks. In one embodiment, each GPC 850 includes a pipeline manager 910, a pre-raster operations unit (PROP) 915, a raster engine 925, a work distribution crossbar (WDX) 980, a memory management unit (MMU) 990, and one or more Texture Processing Clusters (TPCs) 920. It will be appreciated that the GPC 850 of FIG. 9A may include other hardware units in lieu of or in addition to the units shown in FIG. 9A.

In one embodiment, the operation of the GPC 850 is controlled by the pipeline manager 910. The pipeline manager 910 manages the configuration of the one or more TPCs 920 for processing tasks allocated to the GPC 850. In one embodiment, the pipeline manager 910 may configure at least one of the one or more TPCs 920 to implement at least a portion of a graphics rendering pipeline. For example, a TPC 920 may be configured to execute a vertex shader program on the programmable streaming multiprocessor (SM) 940. The pipeline manager 910 may also be configured to route packets received from the work distribution unit 825 to the appropriate logical units within the GPC 850. For example, some packets may be routed to fixed function hardware units in the PROP 915 and/or raster engine 925 while other packets may be routed to the TPCs 920 for processing by the primitive engine 935 or the SM 940.

The PROP unit 915 is configured to route data generated by the raster engine 925 and the TPCs 920 to a Raster Operations (ROP) unit in the partition unit 880, described in more detail below. The PROP unit 915 may also be configured to perform optimizations for color blending, organize pixel data, perform address translations, and the like.

The raster engine 925 includes a number of fixed function hardware units configured to perform various raster operations. In one embodiment, the raster engine 925 includes a setup engine, a course raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine may transmitted to the culling engine where fragments associated with the primitive that fail a z-test are culled, and transmitted to a clipping engine where fragments lying outside a viewing frustum are clipped. Those fragments that survive clipping and culling may be passed to a fine raster engine to generate attributes for the pixel fragments based on the plane equations generated by the setup engine. The output of the raster engine 980 comprises fragments to be processed, for example, by a fragment shader implemented within a TPC 920.

Each TPC 920 included in the GPC 850 includes an M-Pipe Controller (MPC) 930, a primitive engine 935, an SM 940, and one or more texture units 945. The MPC 930 controls the operation of the TPC 920, routing packets received from the pipeline manager 910 to the appropriate units in the TPC 920. For example, packets associated with a vertex may be routed to the primitive engine 935, which is configured to fetch vertex attributes associated with the vertex from the memory 804. In contrast, packets associated with a shader program may be transmitted to the SM 940.

In one embodiment, the texture units 945 are configured to load texture maps (e.g., a 2D array of texels) from the memory 804 and sample the texture maps to produce sampled texture values for use in shader programs executed by the SM 940. The texture units 945 implement texture operations such as filtering operations using mip-maps (i.e., texture maps of varying levels of detail). In one embodiment, each TPC 920 includes four (4) texture units 945.

The SM 940 comprises a programmable streaming processor that is configured to process tasks represented by a number of threads Each SM 940 is multi-threaded and configured to execute a plurality of threads (e.g., 32 threads) from a particular group of threads concurrently. In one embodiment, the SM 940 implements a SIMD (Single-Instruction, Multiple-Data) architecture where each thread in a group of threads (i.e., a warp) is configured to process a different set of data based on the same set of instructions. All threads in the group of threads execute the same instructions. In another embodiment, the SM 940 implements a SIMT (Single-Instruction, Multiple Thread) architecture where each thread in a group of threads is configured to process a different set of data based on the same set of instructions, but where individual threads in the group of threads are allowed to diverge during execution. In other words, when an instruction for the group of threads is dispatched for execution, some threads in the group of threads may be active, thereby executing the instruction, while other threads in the group of threads may be inactive, thereby performing a no-operation (NOP) instead of executing the instruction. The SM 940 may be described in more detail below in conjunction with FIG. 4.

The MMU 990 provides an interface between the GPC 850 and the partition unit 880. The MMU 990 may provide translation of virtual addresses into physical addresses, memory protection, and arbitration of memory requests. In one embodiment, the MMU 990 provides one or more translation lookaside buffers (TLBs) for improving translation of virtual addresses into physical addresses in the memory 804.

Figure 9B:
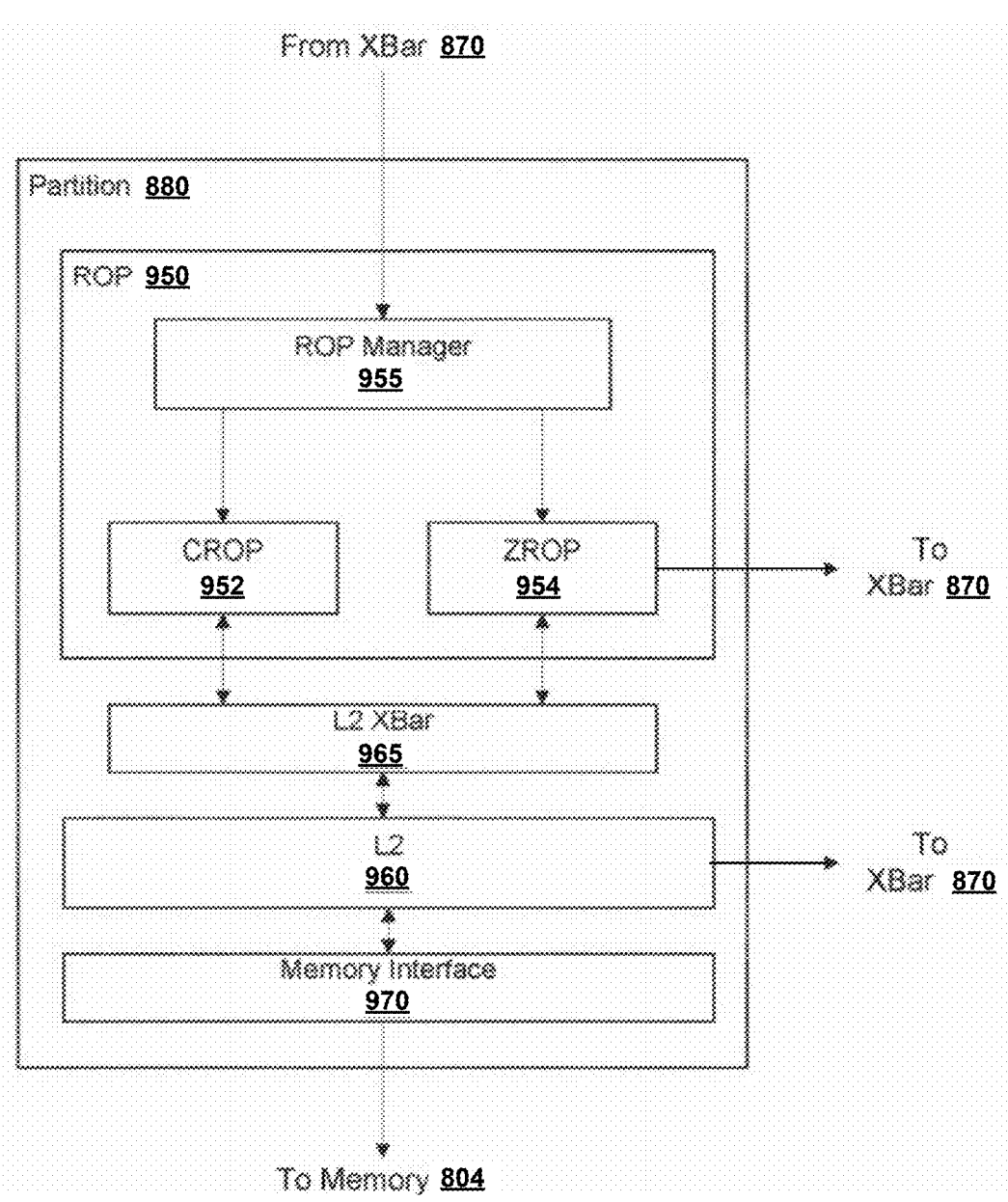

FIG. 9B illustrates a partition unit 880 of the PPU 800 of FIG. 8, in accordance with one embodiment. As shown in FIG. 9B, the partition unit 880 includes a Raster Operations (ROP) unit 950, a level two (L2) cache 960, a memory interface 970, and an L2 crossbar (XBar) 965. The memory interface 970 is coupled to the memory 804. Memory interface 970 may implement 16, 32, 64, 128-bit data buses, or the like, for high-speed data transfer. In one embodiment, the PPU 800 comprises U memory interfaces 970, one memory interface 970 per partition unit 880, where each partition unit 880 is connected to a corresponding memory device 804. For example, PPU 800 may be connected to up to U memory devices 804, such as graphics double-data-rate, version 5, synchronous dynamic random access memory (GDDR5 SDRAM). In one embodiment, the memory interface 970 implements a DRAM interface and U is equal to 6.

In one embodiment, the PPU 800 implements a multi-level memory hierarchy. The memory 804 is located off-chip in SDRAM coupled to the PPU 800. Data from the memory 804 may be fetched and stored in the L2 cache 960, which is located on-chip and is shared between the various GPCs 850. As shown, each partition unit 880 includes a portion of the L2 cache 960 associated with a corresponding memory device 804. Lower level caches may then be implemented in various units within the GPCs 850. For example, each of the SMs 940 may implement a level one (L1) cache. The L1 cache is private memory that is dedicated to a particular SM 940. Data from the L2 cache 960 may be fetched and stored in each of the L1 caches for processing in the functional units of the SMs 940. The L2 cache 960 is coupled to the memory interface 970 and the XBar 870.

The ROP unit 950 includes a ROP Manager 955, a Color ROP (CROP) unit 952, and a Z ROP (ZROP) unit 954. The CROP unit 952 performs raster operations related to pixel color, such as color compression, pixel blending, and the like. The ZROP unit 954 implements depth testing in conjunction with the raster engine 925. The ZROP unit 954 receives a depth for a sample location associated with a pixel fragment from the culling engine of the raster engine 925. The ZROP unit 954 tests the depth against a corresponding depth in a depth buffer for a sample location associated with the fragment. If the fragment passes the depth test for the sample location, then the ZROP unit 954 updates the depth buffer and transmits a result of the depth test to the raster engine 925. The ROP Manager 955 controls the operation of the ROP unit 950. It will be appreciated that the number of partition units 880 may be different than the number of GPCs 850 and, therefore, each ROP unit 950 may be coupled to each of the GPCs 850. Therefore, the ROP Manager 955 tracks packets received from the different GPCs 850 and determines which GPC 850 that a result generated by the ROP unit 950 is routed to. The CROP unit 952 and the ZROP unit 954 are coupled to the L2 cache 960 via an L2 XBar 965.

FIG. 10 illustrates the streaming multi-processor 940 of FIG. 9A, in accordance with one embodiment. As shown in FIG. 10, the SM 940 includes an instruction cache 1005, one or more scheduler units 1010, a register file 1020, one or more processing cores 1050, one or more special function units (SFUs) 1052, one or more load/store units (LSUs) 1054, an interconnect network 1080, and a shared memory/ L1 cache 1070.

As described above, the work distribution unit 825 dispatches tasks for execution on the GPCs 850 of the PPU 800. The tasks are allocated to a particular TPC 920 within a GPC 850 and, if the task is associated with a shader program, the task may be allocated to an SM 940. The scheduler unit 1010 receives the tasks from the work distribution unit 825 and manages instruction scheduling for one or more groups of threads (i.e., warps) assigned to the SM 940. The scheduler unit 1010 schedules threads for execution in groups of parallel threads, where each group is called a warp. In one embodiment, each warp includes 32 threads. The scheduler unit 1010 may manage a plurality of different warps, scheduling the warps for execution and then dispatching instructions from the plurality of different warps to the various functional units (i.e., cores 950, SFUs 952, and LSUs 954) during each clock cycle.

In one embodiment, each scheduler unit 1010 includes one or more instruction dispatch units 1015. Each dispatch unit 1015 is configured to transmit instructions to one or more of the functional units. In the embodiment shown in FIG. 10, the scheduler unit 1010 includes two dispatch units 1015 that enable two different instructions from the same warp to be dispatched during each clock cycle. In alternative embodiments, each scheduler unit 1010 may include a single dispatch unit 1015 or additional dispatch units 1015.

Each SM 940 includes a register file 1020 that provides a set of registers for the functional units of the SM 940. In one embodiment, the register file 1020 is divided between each of the functional units such that each functional unit is allocated a dedicated portion of the register file 1020. In another embodiment, the register file 1020 is divided between the different warps being executed by the SM 940. The register file 1020 provides temporary storage for operands connected to the data paths of the functional units.

Each SM 940 comprises L processing cores 1050. In one embodiment, the SM 940 includes a large number (e.g., 192, etc.) of distinct processing cores 1050. Each core 1050 may include a fully-pipelined, single-precision processing unit that includes a floating point arithmetic logic unit and an integer arithmetic logic unit. The core 1050 may also include a double-precision processing unit including a floating point arithmetic logic unit. In one embodiment, the floating point arithmetic logic units implement the IEEE 754-2008 standard for floating point arithmetic. Each SM 940 also comprises A SFUs 1052 that perform special functions (e.g., pixel blending operations, and the like), and N LSUs 1054 that implement load and store operations between the shared memory/L1 cache 1070 and the register file 1020. In one embodiment, the SM 940 includes 192 cores 1050, 32 SFUs 1052, and 32 LSUs 1054.

Each SM 940 includes an interconnect network 1080 that connects each of the functional units to the register file 1020 and the shared memory/L1 cache 1070. In one embodiment, the interconnect network 1080 is a crossbar that can be configured to connect any of the functional units to any of the registers in the register file 1020 or the memory locations in shared memory/L cache 1070.

The shared memory/L1 cache 1070 is an array of on-chip memory that, in one embodiment, may be configured as either shared memory or an L1 cache, or a combination of both, as the application demands. For example, the shared memory/L1 cache 1070 may comprise 64 KB of storage capacity. The shared memory/L1 cache 1070 may be configured as 64 KB of either shared memory or L1 cache, or a combination of the two such as 16 KB of L1 cache and 48 KB of shared memory.

The PPU 800 described above may be configured to perform highly parallel computations much faster than conventional CPUs. Parallel computing bas advantages in graphics processing, data compression, biometrics, stream processing algorithms, and the like.

In one embodiment, the PPU 800 comprises a graphics processing unit (GPU). The PPU 800 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 800 can be configured to process the graphics primitives to generate a frame buffer (i.e., pixel data for each of the pixels of the display).

An application writes model data for a scene (i.e., a collection of vertices and attributes) to a memory such as a system memory or memory 804. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 940 of the PPU 800 including one or more of a vertex shader, hull shader, domain shader, geometry shader, and a pixel shader. For example, one or more of the SMs 940 may be configured to execute a vertex shader program that processes a number of vertices defined by the model data. In one embodiment, the different SMs 940 may be configured to execute different shader programs concurrently. For example, a first subset of SMs 940 may be configured to execute a vertex shader program while a second subset of SMs 940 may be configured to execute a pixel shader program. The first subset of SMs 940 processes vertex data to produce processed vertex data and writes the processed vertex data to the L2 cache 960 and/or the memory 804. After the processed vertex data is rasterized (i.e., transformed from three-dimensional data into two-dimensional data in screen space) to produce fragment data, the second subset of SMs 940 executes a pixel shader to produce processed fragment data, which is then blended with other processed fragment data and written to the frame buffer in memory 804. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The PPU 800 may be included in a desktop computer, a laptop computer, a tablet computer, a smart-phone (e.g., a wireless, hand-held device), personal digital assistant (PDA), a digital camera, a hand-held electronic device, and the like In one embodiment, the PPU 800 is embodied on a single semiconductor substrate. In another embodiment, the PPU 800 is included in a system-on-a-chip (SoC) along with one or more other logic units such as a reduced instruction set computer (RISC) CPU, a memory management unit (MMU), a digital-to-analog converter (DAC), and the like.

In one embodiment, the PPU 800 may be included on a graphics card that includes one or more memory devices 804 such as GDDR5 SDRAM. The graphics card may be configured to interface with a PCIe slot on a motherboard of a desktop computer that includes, for example, a northbridge chipset and a southbridge chipset. In yet another embodiment, the PPU 800 may be an integrated graphics processing unit (iGPU) included in the chipset (i.e., Northbridge) of the motherboard.

Figure 11:
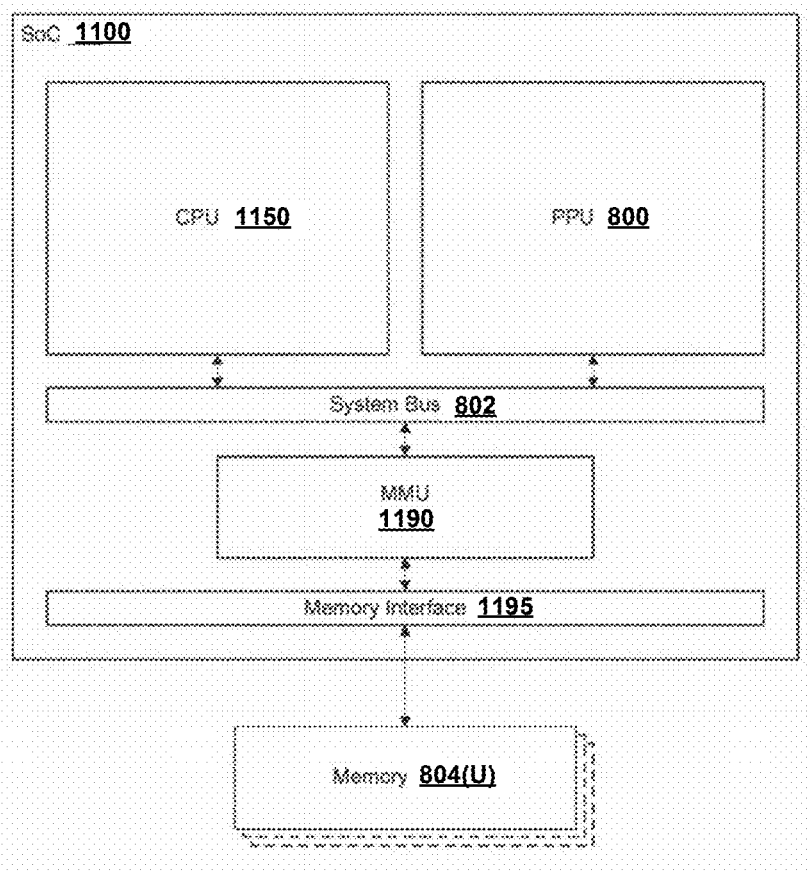
FIG. 11 illustrates an example System-on-Chip (SoC) that can be utilized in accordance with various embodiments.

FIG. 11 illustrates a System-on-Chip (SoC) 1100 including the PPU 800 of FIG. 8, in accordance with one embodiment. As shown in FIG. 11, the SoC 1100 includes a CPU 1150 and a PPU 800, as described above. The SoC 1100 may also include a system bus 802 to enable communication between the various components of the SoC 1100. Memory requests generated by the CPU 1150 and the PPU 800 may be routed through a system MMU 1190 that is shared by multiple components of the SoC 1100. The SoC 1100 may also include a memory interface 1195 that is coupled to one or more memory devices 804. The memory interface 1195 may implement, e.g., a DRAM interface.

Although not shown explicitly, the SoC 1100 may include other components in addition to the components shown in FIG. 11. For example, the SoC 1100 may include multiple PPUs 800 (e.g., four PPUs 800), a video encoder/decoder, and a wireless broadband transceiver as well as other components. In one embodiment, the SoC 1100 may be included with the memory 804 in a package-on-package (PoP) configuration.

Figure 12:
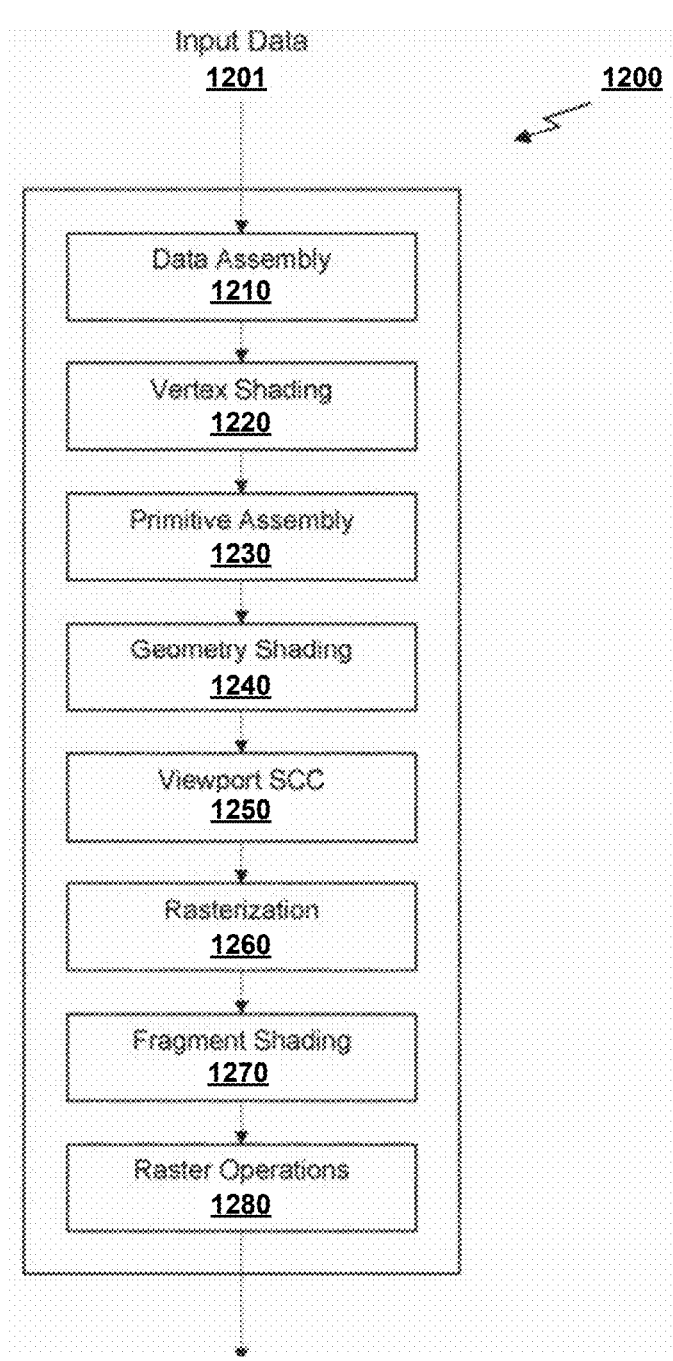
FIG. 12 illustrates a conceptual diagram of a graphics processing pipeline that can be utilized in accordance with various embodiments.

FIG. 12 is a conceptual diagram of a graphics processing pipeline 1200 implemented by the PPU 800 of FIG. 8, in accordance with one embodiment. The graphics processing pipeline 1200 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1200 receives input data 1201 that is transmitted from one stage to the next stage of the graphics processing pipeline 1200 to generate output data 1202. In one embodiment, the graphics processing pipeline 1200 may represent a graphics processing pipeline defined by the OpenGL® API.

As shown in FIG. 12, the graphics processing pipeline 1200 comprises a pipeline architecture that includes a number of stages. The stages include, but are not limited to, a data assembly stage 1210, a vertex shading stage 1220, a primitive assembly stage 1230, a geometry shading stage 1240, a viewport scale, cull, and clip (VSCC) stage 1250, a rasterization stage 1260, a fragment shading stage 1270, and a raster operations stage 1280. In one embodiment, the input data 1201 comprises commands that configure the processing units to implement the stages of the graphics processing pipeline 1200 and geometric primitives (e.g., points, lines, triangles, quads, triangle strips or fans, etc.) to be processed by the stages. The output data 1202 may comprise pixel data (i.e., color data) that is copied into a frame buffer or other type of surface data structure in a memory.

The data assembly stage 1210 receives the input data 1201 that specifies vertex data for high-order surfaces, primitives, or the like. The data assembly stage 1210 collects the vertex data in a temporary storage or queue, such as by receiving a command from the host processor that includes a pointer to a buffer in memory and reading the vertex data from the buffer. The vertex data is then transmitted to the vertex shading stage 1220 for processing.

The vertex shading stage 1220 processes vertex data by performing a set of operations (i.e., a vertex shader or a program) once for each of the vertices. Vertices may be specified as a 4-coordinate vector (i.e., $<x, y, z, w>$), for example, that is associated with one or more vertex attributes (e.g., color, texture coordinates, surface normal, etc.) The vertex shading stage 1220 may manipulate properties such as position, color, texture coordinates, and the like. In other words, the vertex shading stage 1220 performs operations on the vertex coordinates or other vertex attributes associated with a vertex. Such operations commonly including lighting operations (i.e., modifying color attributes for a vertex) and transformation operations (i.e., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 1220 generates transformed vertex data that is transmitted to the primitive assembly stage 1230.

The primitive assembly stage 1230 collects vertices output by the vertex shading stage 1220 and groups the vertices into geometric primitives for processing by the geometry shading stage 1240. For example, the primitive assembly stage 1230 may be configured to group every three consecutive vertices as a geometric primitive (i.e., a triangle) for transmission to the geometry shading stage 1240. In some embodiments, specific vertices may be reused for consecutive geometric primitives (e.g., two consecutive triangles in a triangle strip may share two vertices). The primitive assembly stage 1230 transmits geometric primitives (i.e, a collection of associated vertices) to the geometry shading stage 1240.

The geometry shading stage 1240 processes geometric primitives by performing a set of operations (i.e., a geometry shader or program) on the geometric primitives. Tessellation operations may generate one or more geometric primitives from each geometric primitive. In other words, the geometry shading stage 1240 may subdivide each geometric primitive into a finer mesh of two or more geometric primitives for processing by the rest of the graphics processing pipeline 1200. The geometry shading stage 1240 transmits geometric primitives to the viewport SCC stage 1250.

The viewport SCC stage 1250 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (i.e., discarded) because the geometric primitive will not contribute to the final rendered scene. Any geometric primitive that is partially inside the viewing frustum and partially outside the viewing frustum may be clipped (i.e., transformed into a new geometric primitive that is enclosed within the viewing frustum. Furthermore, geometric primitives may each be scaled based on a depth of the viewing frustum. All potentially visible geometric primitives are then transmitted to the rasterization stage 1260.

The rasterization stage 1260 converts the 3D geometric primitives into 2D fragments. The rasterization stage 1260 may be configured to utilize the vertices of the geometric primitives to setup a set of plane equations from which various attributes can be interpolated. The rasterization stage 1260 may also compute a coverage mask for a plurality of pixels that indicates whether one or more sample locations for the pixel intercept the geometric primitive. In one embodiment, z-testing may also be performed to determine if the geometric primitive is occluded by other geometric primitives that have already been rasterized. The rasterization stage 1260 generates fragment data (i.e., interpolated vertex attributes associated with a particular sample location for each covered pixel) that are transmitted to the fragment shading stage 1270.

The fragment shading stage 1270 processes fragment data by performing a set of operations (i.e., a fragment shader or a program) on each of the fragments. The fragment shading stage 1270 may generate pixel data (i.e., color values) for the fragment such as by performing lighting operations or sampling texture maps using interpolated texture coordinates for the fragment. The fragment shading stage 1270 generates pixel data that is transmitted to the raster operations stage 1280.

The raster operations stage 1280 may perform various operations on the pixel data such as performing alpha tests, stencil tests, and blending the pixel data with other pixel data corresponding to other fragments associated with the pixel. When the raster operations stage 1280 has finished processing the pixel data (i.e., the output data 1202), the pixel data may be written to a render target such as a frame buffer, a color buffer, or the like.

It will be appreciated that one or more additional stages may be included in the graphics processing pipeline 1200 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 1240). Other types of graphics processing pipelines are contemplated as being within the scope of the present disclosure. Furthermore, any of the stages of the graphics processing pipeline 1200 may be implemented by one or more dedicated hardware units within a graphics processor such as PPU 800. Other stages of the graphics processing pipeline 1200 may be implemented by programmable hardware units such as the SM 940 of the PPU 800.

The graphics processing pipeline 1200 may be implemented via an application executed by a host processor, such as a CPU 1150. In one embodiment, a device driver may implement an application programming interface (API) that defines various functions that can be utilized by an application in order to generate graphical data for display. The device driver is a software program that includes a plurality of instructions that control the operation of the PPU 800. The API provides an abstraction for a programmer that lets a programmer utilize specialized graphics hardware, such as the PPU 800, to generate the graphical data without requiring the programmer to utilize the specific instruction set for the PPU 800. The application may include an API call that is routed to the device driver for the PPU 800. The device driver interprets the API call and performs various operations to respond to the API call In some instances, the device driver may perform operations by executing instructions on the CPU 1150. In other instances, the device driver may perform operations, at least in part, by launching operations on the PPU 800 utilizing an input/output interface between the CPU 1150 and the PPU 800. In one embodiment, the device driver is configured to implement the graphics processing pipeline 1200 utilizing the hardware of the PPU 800.

Various programs may be executed within the PPU 800 in order to implement the various stages of the graphics processing pipeline 1200. For example, the device driver may launch a kernel on the PPU 800 to perform the vertex shading stage 1220 on one SM 940 (or multiple SMs 940). The device driver (or the initial kernel executed by the PPU 800) may also launch other kernels on the PPU 800 to perform other stages of the graphics processing pipeline 1200, such as the geometry shading stage 1240 and the fragment shading stage 1270. In addition, some of the stages of the graphics processing pipeline 1200 may be implemented on fixed unit hardware such as a rasterizer or a data assembler implemented within the PPU 800. It will be appreciated that results from one kernel may be processed by one or more intervening fixed function hardware units before being processed by a subsequent kernel on an SM 940.

Figure 13:
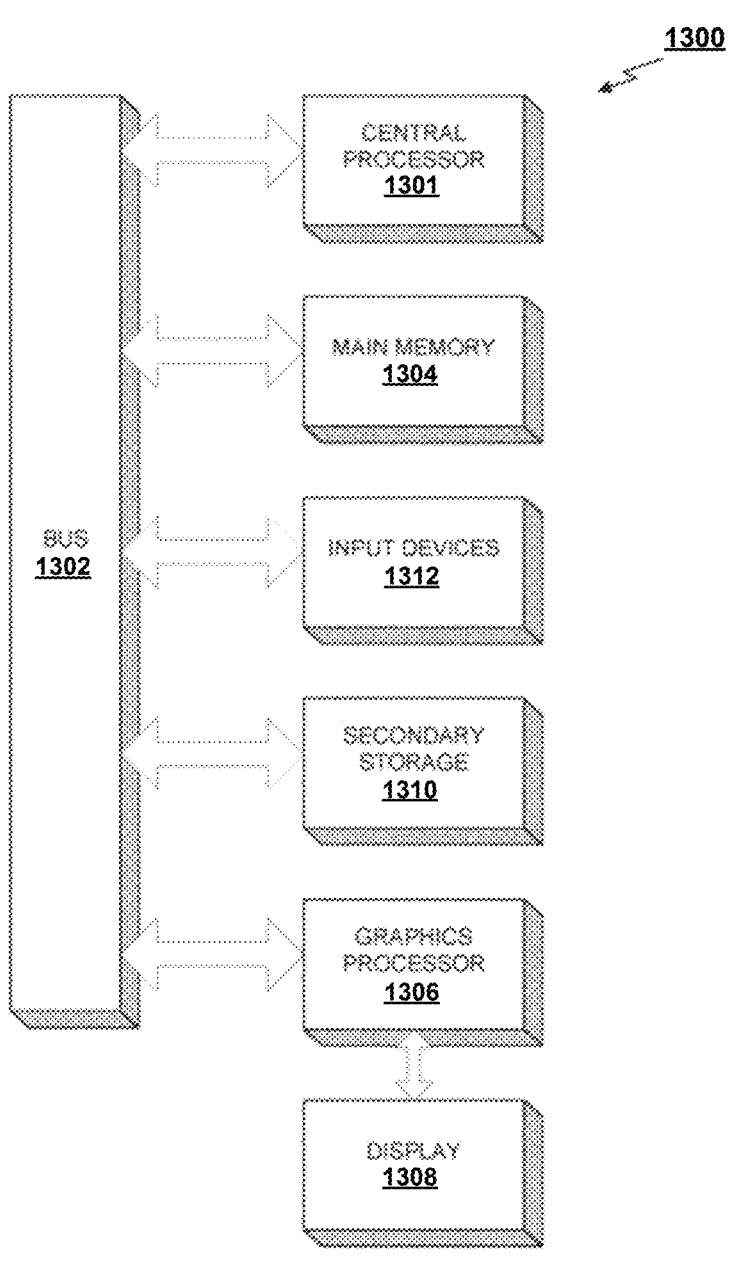
FIG. 13 illustrates components of an example computing system that can be utilized to implement aspects of the various embodiments.

FIG. 13 illustrates an exemplary system 1300 in which the various architecture and/or functionality of the various previous embodiments may be implemented. As shown, a system 1300 is provided including at least one central processor 1301 that is connected to a communication bus 1302. The communication bus 1302 may be implemented using any suitable protocol, such as PCI (Peripheral Component Interconnect), PCI-Express, AGP (Accelerated Graphics Port), HyperTransport, or any other bus or point-to-point communication protocol(s). The system 1300 also includes a main memory 1304. Control logic (software) and data are stored in the main memory 1304 which may take the form of random access memory (RAM).

The system 1300 also includes input devices 1312, a graphics processor 1306, and a display 1308, i.e. a conventional CRT (cathode ray tube), LCD (liquid crystal display), LED (light emitting diode), plasma display or the like. User input may be received from the input devices 1312, e.g., keyboard, mouse, touchpad, microphone, and the like. In one embodiment, the graphics processor 1306 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1300 may also include a secondary storage 1310. The secondary storage 1310 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1304 and/or the secondary storage 1310. Such computer programs, when executed, enable the system 1300 to perform various functions. The memory 1304, the storage 1310, and/or any other storage are possible examples of computer-readable media.

In one embodiment, the architecture and/or functionality of the various previous figures may be implemented in the context of the central processor 1301, the graphics processor 1306, an integrated circuit (not shown) that is capable of at least a portion of the capabilities of both the central processor 1301 and the graphics processor 1306, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1300 may take the form of a desktop computer, laptop computer, server, workstation, game consoles, embedded system, and/or any other type of logic. Still yet, the system 1300 may take the form of various other devices including, but not limited to a personal digital assistant (PDA) device, a mobile phone device, a television, etc.

Further, while not shown, the system 1300 may be coupled to a network (e.g., a telecommunications network, local area network (LAN), wireless network, wide area network (WAN) such as the Internet, peer-to-peer network, cable network, or the like) for communication purposes.

The various embodiments can be implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP or FTP. The network can be, for example, a local area network, a wide-area network, a virtual private network, the Internet, an intranet, an extranet, a public switched telephone network, an infrared network, a wireless network and any combination thereof. In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Python, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments The specification and drawings are, accordingly, to be regarded in an illustrative rather than a restrictive sense. It will, however, be evident that various modifications and changes may be made thereunto without departing from the broader spirit and scope of the invention as set forth in the claims.

27

What is claimed is:

1. A computer-implemented method, comprising:

determining, using one or more processors of one or more graphics processing units (GPUs), a particle simulation to be performed;

allocating, using the one or more processors, topology data at a first time step for the particle simulation to a sparse volume tree including a hierarchy of nodes, wherein leaf nodes of the sparse volume tree correspond to bricks of voxels, the voxels representing positions of particles during the particle simulation;

spatially dividing the bricks of voxels into subcells sized based at least on an application executed using the one or more GPUs and associated with the particle simulation and at least one capability of one or more processors to perform the particle simulation, the subcells representing subvolumes of particles for the particle simulation;

marking one or more nodes of the hierarchy of nodes at a second time step, the one or more nodes being associated with both the first time step and the second time step;

identifying one or more new nodes to the hierarchy of nodes associated with the second time step;

removing, from a representation of the sparse volume tree stored in memory accessible to the one or more GPUs, the one or more marked nodes;

updating the representation of the sparse volume tree stored in the memory with topology data for the second time step to include the one or more new nodes; and generating, using a computer graphics application executed by the one or more processors, a graphical representation of the particle simulation, wherein the graphical representation includes a rendered visualization of a projection of behavior information for respective subcells.

2. The computer-implemented method of claim 1, wherein the at least one capability corresponds to a thread block size for at least one GPU of the one or more GPUs for performing at least a portion of the particle simulation.

3. The computer-implemented method of claim 1, further comprising:

generating a subcell particle list to be shared by all voxels in a respective subcell.

4. The computer-implemented method of claim 3, wherein the behavior information includes velocities and density information for the respective subcells, and further comprising:

computing a summation of particles contributing to a velocity of a selected voxel at least in part by determining contributing particles from the subcell particle list.

5. The computer-implemented method of claim 1, further comprising:

rasterizing an influence of a selected particle, for the particle simulation, in order to determine a subset of relevant subcells for the selected particle.

6. The computer-implemented method of claim 1, wherein the particle simulation corresponds to a fluid simulation for the computer graphics application.

7. The computer-implemented method of claim 1, wherein the subcells include subsets of a point cloud for accelerating a hardware test using a Voronoi generation algorithm.

8. A computer-implemented method, comprising:

allocating topology data at a first time step for, a particle simulation of at least a million particles, the particle simulation using a matrix-free conjugate gradient solver with neighboring vectors in a set of vectors, to a sparse volume tree including a hierarchy of nodes, wherein leaf nodes of the sparse volume tree correspond to bricks of voxels, the voxels representing positions of particles during the particle simulation, the bricks of voxels being spatially divided into subcells based at least on an application associated with the particle simulation and at least one capability of one or more processors to perform the particle simulation;

generating the set of vectors including voxel data from the sparse volume tree, the set of vectors excluding zero value elements of the sparse volume;

marking one or more nodes of the hierarchy of nodes at a second time step, the one or more nodes being associated with both the first time step and the second time step;

identifying one or more new nodes to the hierarchy of nodes associated with the second time step;

removing, from the sparse volume tree, the one or more marked nodes;

updating topology data for the second time step to include the one or more new nodes; and generating, using a computer graphics application executed by the one or more processors, a graphical representation of the particle simulation, wherein the graphical representation includes a rendered visualization of a projection of behavior information for respective subcells.

9. The computer-implemented method of claim 8, wherein the vectors correspond to rows of a sparse matrix for the matrix-free conjugate gradient solver.

10. The computer-implemented method of claim 9, wherein the rows further correspond to a pressure equation for the particle simulation, and wherein diagonal values of the sparse matrix correspond to a number of non-solid neighboring voxels.

11. The computer-implemented method of claim 8, wherein the particle simulation corresponds to a fluid simulation for the computer graphics application.

12. The computer-implemented method of claim 8, wherein the matrix-free conjugate gradient solver is a spatially sparse fluid-implicit particle (FLIP) solver running on GPU hardware.

13. The computer-implemented method of claim 12, further comprising:

optimizing a simulation pipeline for the particle simulation for parallel execution on the GPU hardware using the voxels for at least one of storage, compute, or rendering.

14. The computer-implemented method of claim 8, wherein the matrix-free conjugate gradient solver is used to determine matrix elements dynamically without need to store a sparse matrix in memory.

15. A computer-implemented method, comprising:

performing a particle simulation for up to 75 million particles using a matrix-free conjugate gradient solver with neighboring vectors in a set a vectors, comprising:

allocating topology data at a first time step for the particle simulation to a sparse volume tree including a hierarchy of nodes, wherein leaf nodes of the sparse volume tree correspond to bricks of voxels, the voxels representing positions of particles during the particle simulation;

spatially dividing the bricks of voxels into subcells sized based at least on an application associated with the particle simulation and at least one capability of one or more processors to perform the particle simulation, the subcells representing subvolumes of particles for the particle simulation;

generating the set of vectors including voxel data from the subcells, the set of vectors excluding zero value elements of the sparse volume;

marking one or more nodes of the hierarchy of nodes at a second time step, the one or more nodes being associated with both the first time step and the second time step;

identifying one or more new nodes to the hierarchy of nodes associated with the second time step;

removing, from the sparse volume tree, the one or more marked nodes;

updating topology data for the second time step to include the one or more new nodes; and generating, using a computer graphics application executed by the one or more processors, a graphical representation of the particle simulation, wherein the graphical representation includes a rendered visualization of a projection of behavior information for respective subcells.

16. The computer-implemented method of claim 15, wherein the at least one capability corresponds to a thread block size for a graphics processing unit (GPU) for performing at least a portion of the particle simulation.

17. The computer-implemented method of claim 15, further comprising:

generating a subcell particle list to be shared by all voxels in a respective subcell.

18. The computer-implemented method of claim 17, wherein the behavior information includes velocities and density information for the respective subcells, and further comprising:

computing a summation of particles contributing to a velocity of a selected voxel at least in part by determining contributing particles from the subcell particle list.

19. The computer-implemented method of claim 15, wherein the matrix-free conjugate gradient solver is a spatially sparse fluid-implicit particle (FLIP) solver running on GPU hardware.

20. The computer-implemented method of claim 19, further comprising:

optimizing a simulation pipeline for the particle simulation for parallel execution on the GPU hardware using the voxels for at least one of storage, compute, or rendering.

*    *    *    *    *